United States Patent [19]

Makihara et al.

[11] Patent Number: 5,383,205

[45] Date of Patent: Jan. 17, 1995

[54] SEMICONDUCTOR MEMORY DEVICE HAVING AN ERROR CORRECTION CIRCUIT AND AN ERROR CORRECTION METHOD OF DATA IN A SEMICONDUCTOR MEMORY DEVICE

[75] Inventors: Hiroyasu Makihara; Kenji Kohda, both of Hyogo, Japan

[73] Assignee: Mitsubishi Denki Kabushiki Kaisha, Tokyo, Japan

[21] Appl. No.: 894,661

[22] Filed: Jun. 5, 1992

[30] Foreign Application Priority Data

Jun. 24, 1991 [JP] Japan .................................. 3-151809

[51] Int. Cl.⁶ .............................................. G06F 11/10
[52] U.S. Cl. ................................................. 371/40.1
[58] Field of Search .................... 371/40.1, 37.1, 37.4, 371/37.6, 38.1

[56] References Cited

U.S. PATENT DOCUMENTS

| | | | |
|---|---|---|---|
| 4,649,540 | 3/1987 | Proebsting | 371/37.1 |
| 4,780,875 | 10/1988 | Sakai | 371/38 |
| 4,958,352 | 9/1990 | Noguchi et al. | 371/40.1 |

OTHER PUBLICATIONS

"Dual ECC Scheme to Reduce Read-Modify-Write Cycles on a 32-bit Data Bus Memory System" IBM Technical Disclosure Bulletin, vol. 28, No. 6, Nov. 1985, p. 2561.

*Primary Examiner*—Roy N. Envall, Jr.
*Assistant Examiner*—Emmanuel Moise
*Attorney, Agent, or Firm*—Lowe, Price, LeBlanc & Becker

[57] ABSTRACT

A mask ROM having an ECC for error correction by carrying out operation according to a Hamming matrix in which all but 2 of 6 elements in one column and the other column match each other. The columns correspond to 32 data that will be provided to an external source, and the one column corresponds to the other column by 16 columns. The ECC is implemented so that one half of 32 correction signals with which exclusive ORs are to be taken with 32 data, are generated by a circuit identical to that of a circuit for generating the other half of the 32 correction signals; and the circuit for taking the exclusive ORs from one half of the 32 data and the corresponding correction signals can be used for taking exclusive ORs from the remaining half of the 32 data and the corresponding correction signals. The number of component elements for the correction signal generator and for the data correction circuit, and the number of input signal lines to the data correction circuit are reduced to a half, alleviating the circuit complexity of the entire ECC in comparison with that of a conventional one.

17 Claims, 20 Drawing Sheets

FIG. 5

| CIRCUIT BLOCK(OUTPUT) | INPUT SIGNAL | I1 | I2 | I3 | I4 | I5 | I6 | I7 | I8 | I9 | I10 | I11 | I12 | I13 | I14 | I15 | I16 |
|---|---|---|---|---|---|---|---|---|---|---|---|---|---|---|---|---|---|
| 110-1 | (S0, $\overline{S0}$) | d10 | d11 | d12 | d15 | d16 | d17 | d18 | d21 | d22 | d23 | d24 | d26 | d27 | d28 | d31 | P0 |
| 110-2 | (S1, $\overline{S1}$) | d8 | d10 | d13 | d14 | d15 | d16 | d17 | d18 | d19 | d20 | d24 | d26 | d29 | d30 | d31 | P1 |
| 110-3 | (S2, $\overline{S2}$) | d3 | d4 | d5 | d6 | d7 | d8 | d11 | d13 | d14 | d19 | d20 | d25 | d26 | d29 | d30 | P2 |
| 110-4 | (S3, $\overline{S3}$) | d1 | d2 | d4 | d6 | d7 | d9 | d10 | d14 | d17 | d18 | d20 | d22 | d23 | d28 | d30 | P3 |
| 110-5 | (S4, $\overline{S4}$) | d0 | d2 | d3 | d7 | d9 | d12 | d16 | d18 | d19 | d23 | d25 | d27 | d29 | d30 | d31 | P4 |
| 110-6 | (S5, $\overline{S5}$) | d0 | d1 | d4 | d5 | d9 | d12 | d13 | d14 | d15 | d16 | d17 | d19 | d21 | d25 | d28 | P5 |

FIG. 7

| CIRCUIT BLOCK(OUTPUT) \ INPUT SIGNAL | $i_1$ | $\overline{i_1}$ | $i_2$ | $i_3$ | $i_4$ | $i_5$ | $i_6$ | $\overline{i_6}$ |
|---|---|---|---|---|---|---|---|---|
| 111-1 ($e_0$, $e_{16}$) | $\overline{S_0}$ | $S_0$ | $\overline{S_2}$ | $\overline{S_3}$ | $S_4$ | $S_5$ | $\overline{S_1}$ | $S_1$ |
| 111-2 ($e_1$, $e_{17}$) | $\overline{S_0}$ | $S_0$ | $\overline{S_2}$ | $S_3$ | $\overline{S_4}$ | $S_5$ | $\overline{S_1}$ | $S_1$ |
| 111-3 ($e_2$, $e_{18}$) | $\overline{S_0}$ | $S_0$ | $\overline{S_2}$ | $S_3$ | $S_4$ | $\overline{S_5}$ | $\overline{S_1}$ | $S_1$ |
| 111-4 ($e_3$, $e_{19}$) | $\overline{S_1}$ | $S_1$ | $\overline{S_0}$ | $S_2$ | $\overline{S_3}$ | $S_4$ | $\overline{S_5}$ | $S_5$ |
| 111-5 ($e_4$, $e_{20}$) | $\overline{S_1}$ | $S_1$ | $\overline{S_0}$ | $S_2$ | $S_3$ | $\overline{S_4}$ | $S_5$ | $\overline{S_5}$ |
| 111-6 ($e_5$, $e_{21}$) | $\overline{S_0}$ | $S_0$ | $\overline{S_1}$ | $\overline{S_3}$ | $\overline{S_4}$ | $S_5$ | $S_2$ | $\overline{S_2}$ |
| 111-7 ($e_6$, $e_{22}$) | $\overline{S_0}$ | $S_0$ | $S_1$ | $S_3$ | $\overline{S_4}$ | $\overline{S_5}$ | $S_2$ | $\overline{S_2}$ |
| 111-8 ($e_7$, $e_{23}$) | $\overline{S_0}$ | $S_0$ | $\overline{S_1}$ | $S_3$ | $S_4$ | $\overline{S_5}$ | $S_2$ | $\overline{S_2}$ |
| 111-9 ($e_8$, $e_{24}$) | $\overline{S_0}$ | $S_0$ | $S_1$ | $\overline{S_3}$ | $\overline{S_4}$ | $\overline{S_5}$ | $S_2$ | $\overline{S_2}$ |
| 111-10 ($e_9$, $e_{25}$) | $\overline{S_2}$ | $S_2$ | $\overline{S_0}$ | $\overline{S_1}$ | $S_4$ | $S_5$ | $S_3$ | $\overline{S_3}$ |
| 111-11 ($e_{10}$, $e_{26}$) | $\overline{S_2}$ | $S_2$ | $S_0$ | $S_1$ | $\overline{S_4}$ | $\overline{S_5}$ | $S_3$ | $\overline{S_3}$ |
| 111-12 ($e_{11}$, $e_{27}$) | $S_2$ | $\overline{S_2}$ | $S_0$ | $\overline{S_1}$ | $\overline{S_3}$ | $\overline{S_5}$ | $\overline{S_4}$ | $S_4$ |
| 111-13 ($e_{12}$, $e_{28}$) | $\overline{S_3}$ | $S_3$ | $S_0$ | $\overline{S_1}$ | $\overline{S_2}$ | $S_5$ | $S_4$ | $\overline{S_4}$ |
| 111-14 ($e_{13}$, $e_{29}$) | $\overline{S_4}$ | $S_4$ | $\overline{S_0}$ | $S_1$ | $S_2$ | $\overline{S_3}$ | $S_5$ | $\overline{S_5}$ |
| 111-15 ($e_{14}$, $e_{30}$) | $\overline{S_4}$ | $S_4$ | $\overline{S_0}$ | $S_1$ | $S_2$ | $S_3$ | $\overline{S_5}$ | $S_5$ |
| 111-16 ($e_{15}$, $e_{31}$) | $\overline{S_4}$ | $S_4$ | $S_0$ | $S_1$ | $\overline{S_2}$ | $\overline{S_3}$ | $S_5$ | $\overline{S_5}$ |

FIG.14 PRIOR ART

| CIRCUIT BLOCK (OUTPUT SIGNAL) | INPUT SIGNAL | | | | | | | | | | | | | | | |
|---|---|---|---|---|---|---|---|---|---|---|---|---|---|---|---|---|
| | I1 | I2 | I3 | I4 | I5 | I6 | I7 | I8 | I9 | I10 | I11 | I12 | I13 | I14 | I15 | I16 |
| 90-1 ($S_0$, $\overline{S_0}$) | $d_{10}$ | $d_{11}$ | $d_{12}$ | $d_{13}$ | $d_{14}$ | $d_{15}$ | $d_{16}$ | $d_{17}$ | $d_{25}$ | $d_{26}$ | $d_{27}$ | $d_{28}$ | $d_{29}$ | $d_{30}$ | $d_{31}$ | $P_0$ |
| 90-2 ($S_1$, $\overline{S_1}$) | $d_{11}$ | $d_{12}$ | $d_{13}$ | $d_{14}$ | $d_{15}$ | $d_{16}$ | $d_{17}$ | $d_{18}$ | $d_{19}$ | $d_{20}$ | $d_{21}$ | $d_{22}$ | $d_{23}$ | $d_{24}$ | $d_{25}$ | $P_1$ |
| 90-3 ($S_2$, $\overline{S_2}$) | $d_4$ | $d_5$ | $d_6$ | $d_7$ | $d_8$ | $d_9$ | $d_{10}$ | $d_{18}$ | $d_{19}$ | $d_{20}$ | $d_{21}$ | $d_{22}$ | $d_{23}$ | $d_{24}$ | $d_{25}$ | $P_2$ |
| 90-4 ($S_3$, $\overline{S_3}$) | $d_1$ | $d_2$ | $d_3$ | $d_7$ | $d_8$ | $d_9$ | $d_{14}$ | $d_{15}$ | $d_{16}$ | $d_{22}$ | $d_{23}$ | $d_{24}$ | $d_{29}$ | $d_{30}$ | $d_{31}$ | $P_3$ |
| 90-5 ($S_4$, $\overline{S_4}$) | $d_0$ | $d_2$ | $d_3$ | $d_5$ | $d_6$ | $d_9$ | $d_{12}$ | $d_{13}$ | $d_{16}$ | $d_{21}$ | $d_{22}$ | $d_{24}$ | $d_{29}$ | $d_{28}$ | $d_{31}$ | $P_4$ |
| 90-6 ($S_5$, $\overline{S_5}$) | $d_0$ | $d_1$ | $d_3$ | $d_4$ | $d_6$ | $d_8$ | $d_{11}$ | $d_{13}$ | $d_{15}$ | $d_{19}$ | $d_{21}$ | $d_{23}$ | $d_{26}$ | $d_{28}$ | $d_{30}$ | $P_5$ |

FIG. 16 PRIOR ART

| CIRCUIT BLOCK (OUTPUT SIGNAL) | INPUT SIGNAL: $i_1$ $i_2$ $i_3$ $i_4$ $i_5$ $i_6$ |
|---|---|
| 91-1 ($e_0$) | $\overline{S_0}$ $\overline{S_1}$ $\overline{S_2}$ $\overline{S_3}$ $S_4$ $S_5$ |
| 91-2 ($e_1$) | $\overline{S_0}$ $\overline{S_1}$ $\overline{S_2}$ $S_3$ $\overline{S_4}$ $S_5$ |
| 91-3 ($e_2$) | $\overline{S_0}$ $\overline{S_1}$ $\overline{S_2}$ $S_3$ $S_4$ $\overline{S_5}$ |
| 91-4 ($e_3$) | $\overline{S_0}$ $\overline{S_1}$ $\overline{S_2}$ $S_3$ $S_4$ $S_5$ |
| 91-5 ($e_4$) | $\overline{S_0}$ $\overline{S_1}$ $S_2$ $\overline{S_3}$ $\overline{S_4}$ $S_5$ |
| 91-6 ($e_5$) | $\overline{S_0}$ $\overline{S_1}$ $S_2$ $\overline{S_3}$ $S_4$ $\overline{S_5}$ |
| 91-7 ($e_6$) | $\overline{S_0}$ $\overline{S_1}$ $S_2$ $\overline{S_3}$ $S_4$ $S_5$ |
| 91-8 ($e_7$) | $\overline{S_0}$ $\overline{S_1}$ $S_2$ $S_3$ $\overline{S_4}$ $S_5$ |
| 91-9 ($e_8$) | $\overline{S_0}$ $\overline{S_1}$ $S_2$ $S_3$ $\overline{S_4}$ $S_5$ |
| 91-10 ($e_9$) | $\overline{S_0}$ $\overline{S_1}$ $S_2$ $S_3$ $S_4$ $\overline{S_5}$ |
| 91-11 ($e_{10}$) | $S_0$ $\overline{S_1}$ $S_2$ $\overline{S_3}$ $\overline{S_4}$ $\overline{S_5}$ |
| 91-12 ($e_{11}$) | $S_0$ $\overline{S_1}$ $\overline{S_2}$ $\overline{S_3}$ $\overline{S_4}$ $S_5$ |
| 91-13 ($e_{12}$) | $S_0$ $S_1$ $\overline{S_2}$ $\overline{S_3}$ $S_4$ $\overline{S_5}$ |
| 91-14 ($e_{13}$) | $S_0$ $S_1$ $\overline{S_2}$ $\overline{S_3}$ $S_4$ $S_5$ |
| 91-15 ($e_{14}$) | $S_0$ $S_1$ $\overline{S_2}$ $\overline{S_3}$ $\overline{S_4}$ $\overline{S_5}$ |
| 91-16 ($e_{15}$) | $S_0$ $S_1$ $\overline{S_2}$ $S_3$ $\overline{S_4}$ $S_5$ |
| 91-17 ($e_{16}$) | $S_0$ $S_1$ $\overline{S_2}$ $S_3$ $S_4$ $\overline{S_5}$ |
| 91-18 ($e_{17}$) | $S_0$ $S_1$ $\overline{S_2}$ $\overline{S_3}$ $\overline{S_4}$ $\overline{S_5}$ |
| 91-19 ($e_{18}$) | $\overline{S_0}$ $S_1$ $S_2$ $\overline{S_3}$ $\overline{S_4}$ $\overline{S_5}$ |
| 91-20 ($e_{19}$) | $\overline{S_0}$ $S_1$ $S_2$ $\overline{S_3}$ $\overline{S_4}$ $S_5$ |
| 91-21 ($e_{20}$) | $\overline{S_0}$ $S_1$ $S_2$ $\overline{S_3}$ $S_4$ $\overline{S_5}$ |
| 91-22 ($e_{21}$) | $\overline{S_0}$ $S_1$ $S_2$ $\overline{S_3}$ $S_4$ $S_5$ |
| 91-23 ($e_{22}$) | $\overline{S_0}$ $S_1$ $S_2$ $S_3$ $\overline{S_4}$ $\overline{S_5}$ |
| 91-24 ($e_{23}$) | $\overline{S_0}$ $S_1$ $S_2$ $S_3$ $\overline{S_4}$ $S_5$ |
| 91-25 ($e_{24}$) | $\overline{S_0}$ $S_1$ $S_2$ $S_3$ $S_4$ $\overline{S_5}$ |

| | |
|---|---|
| 91-26 ($e_{25}$) | $S_0$ $\overline{S_1}$ $S_2$ $\overline{S_3}$ $\overline{S_4}$ $\overline{S_5}$ |
| 91-27 ($e_{26}$) | $S_0$ $\overline{S_1}$ $S_2$ $S_3$ $\overline{S_4}$ $\overline{S_5}$ |
| 91-28 ($e_{27}$) | $S_0$ $\overline{S_1}$ $S_2$ $S_3$ $S_4$ $S_5$ |
| 91-29 ($e_{28}$) | $S_0$ $\overline{S_1}$ $\overline{S_2}$ $\overline{S_3}$ $S_4$ $S_5$ |
| 91-30 ($e_{29}$) | $S_0$ $\overline{S_1}$ $\overline{S_2}$ $S_3$ $\overline{S_4}$ $S_5$ |
| 91-31 ($e_{30}$) | $S_0$ $S_1$ $\overline{S_2}$ $S_3$ $\overline{S_4}$ $S_5$ |
| 91-32 ($e_{31}$) | $S_0$ $\overline{S_1}$ $\overline{S_2}$ $S_3$ $S_4$ $\overline{S_5}$ |

↓ CONTINUE TO RIGHT COLUMN

FIG. 19 PRIOR ART

| OUTPUT OF DATA SELECTOR / SELECT SIGNAL | $\overline{SE}$ | SE |
|---|---|---|
| D16 ~ D31 | H | L |
| D0 ~ D15 | L | H |

FIG. 20

| A | B | A ⊕ B |
|---|---|---|
| 0 | 0 | 0 |
| 0 | 1 | 1 |
| 1 | 0 | 1 |
| 1 | 1 | 0 |

FIG. 21

| A | B | A X B |
|---|---|---|
| 0 | 0 | 0 |
| 1 | 0 | 0 |
| 0 | 1 | 0 |
| 1 | 1 | 1 | ns
SEMICONDUCTOR MEMORY DEVICE HAVING AN ERROR CORRECTION CIRCUIT AND AN ERROR CORRECTION METHOD OF DATA IN A SEMICONDUCTOR MEMORY DEVICE

BACKGROUND OF THE INVENTION

1. Field of the Invention

The present invention relates to a semiconductor device and an error correction method of data thereof, and more particularly, to a semiconductor memory device having an improved error correction circuit, and an error correction method for reducing circuit complexity of an error correction circuit.

2. Description of the Background Art

Some semiconductor memory devices have an error correction circuit (abbreviated as ECC hereinafter) incorporated for error correction of an erroneous data read out from a memory cell array.

The detection of whether there is an error in data of an arbitrary bit length is carried out by appending one bit of data called a parity bit to the data. This method of detection is called parity check. In parity check, the data of a parity bit is set so that the number of bits of ones is even (or odd) of the data to be checked and data of parity bit. Detection of an error of 1 bit is allowed by checking the number of bits of ones.

However, it is not possible to correct an error with parity check since the bit with an error cannot be identified. For the purpose of detecting an error and making a correction, data of a plurality of bits is appended to the data from which an error is to be detected. This data of a plurality of bits is called check bits, which are redundant bits for detection and correction of an error. Check bit data is called parity data hereinafter. Data having check bit appended is called an error correction code.

In general, a parity data of 6 bits and a parity data of 4 bits are required to be appended in correcting a single bit error occurring in data of 32 bits and 8 bits, respectively.

ECC carries out predetermined operation with the read out data and the corresponding parity bit for correcting the error in the read out data to provide eventually as the read out data a corrected data.

Such an ECC is adopted into a mask ROM (Read Only Memory) that has data previously written therein during manufacturing where only data read out is possible thereafter. The application of such ECC in EEPROMs (Electorically Erasable and Programmable ROM) for memory devices that can have data rewritten after manufacturing is proposed in U.S. patent application Ser. No. 4,958,352.

FIG. 10 is a block diagram schematically showing an example of a structure of a conventional mask ROM having an ECC. The structure of a conventional mask ROM having an ECC will be described hereinafter with reference to FIG. 10.

The mask ROM comprises a memory cell array 1 storing original data to be read out to an external source (referred to as a regular memory cell array hereinafter), and a memory cell array 2 storing parity bit for correcting the error in the data read out from memory cell array 1 (referred to as parity memory cell array hereinafter).

Memory cell array 1 comprises 32 blocks of DB0–DB31 corresponding to data of 32 bits. Similarly, parity memory cell array 2 comprises six blocks DP0–DP5 corresponding to a parity data of 6 bits.

A plurality of word lines WL are commonly provided for memory cell array 1 and parity memory cell array 2. A plurality of bit lines BL are provided for each of the 38 blocks of DB0–DB31 and DP0–DP5.

Word lines WL are connected to an X decoder 3. Bit lines B1 are connected to a Y gate 7. An address buffer 5 applies waveform shaping and amplification to an externally applied address signal via address input terminals A0–An to provide the same to X decoder 3 and Y decoder 4. X decoder 3 decodes the address signal from address buffer 5 to activate one of the plurality of word lines WL corresponding to that address signal.

Y decoder decodes the address signal from address buffer 5 to control Y gate 7.

More specifically, Y gate 7 is divided into 32 blocks of YGD0–YGD31 corresponding to the 32 regular memory cell array blocks DB0–DB31, and six blocks of YGP0–YGP5 corresponding to the six parity memory cell array blocks DP0–DP5. Each of the 32 blocks of YGD0–YGD31 in Y gate 7 responds to the decoded output of Y decoder 4 to electrically connect to a sense amplifier group 8 one of the plurality of bit lines of the corresponding regular memory cell array block. Similarly, each of the six blocks YGP0–YGP5 in Y gate 7 responds to the decoded output of Y decoder 4 to electrically connect to sense amplifier group 8 one of the plurality of bit lines BL of the corresponding parity memory cell array block.

Sense amplifier group 8 comprises 32 sense amplifiers SAD0–SAD31 and six sense amplifiers SAP0–SAP5 corresponding to the 32 Y gate blocks YGD0–YGD31 and the 6 Y gate blocks YGP0–YGP5, respectively. Each of the 38 sense amplifiers of SAD0–SAD31 and SAP0–SAP5 senses and amplifies the signal on the one bit line BL electrically connected by a corresponding Y gate block to provide the same to ECC 9.

Each of regular memory cell array blocks DB0–DB31 and parity memory cell array blocks DP0–DP5 comprises a memory cell MC arranged in a matrix of a plurality of rows and columns. Memory cells MC arranged in one row are connected to the same word line WL. Memory cells MC arranged in one column are connected to the same bit line BL.

The activation of one word line WL causes a signal according to the stored data in each memory cell MC connected to that word line WL to appear on the bit line BL connected to that memory cell MC. If there are N columns of the memory cell columns included in each regular memory cell array blocks of DB0–DB31 and each parity memory cell array blocks of DP0–DP5, the stored data of (38×N) memory cells MC connected to the same word line WL are simultaneously provided to Y gate 7.

Each of Y gate blocks YGD0–YGD31 provided corresponding to regular memory cell array 1 electrically connects only one bit line BL in the corresponding regular memory cell array block to a corresponding sense amplifier. Similarly, each of Y gate blocks YGP0–YGP5 provided corresponding to parity memory cell array 2 connects only one bit line BL of the corresponding parity memory cell array block to a corresponding sense amplifier. Therefore, sense amplifier group 8 amplifies one of the N data signals provided from memory cell array block DB0 to Y gate block YGD0, one of the N data signals provided from memory cell array block DB1 to Y gate block YGD1, . . . , one of the N data signals provided from memory cell array block DB31 to Y gate block YGD31, one of the N data signals provided from parity memory cell array block DP0 to Y gate block YGP0, . . . , and one of the N data signals provided from parity memory cell array block DP5 to Y gate block YGP5, to provide the same as an input signal of d0, d1, . . . , d31, P0, . . . , P5, respectively, to ECC 9.

Thus, the stored data of 38 memory cells MC connected to the same word line are read out to ECC 9 from respective ones of regular memory cell array blocks DB0-DB31 and parity memory cell array blocks DP0-DP5.

A predetermined parity data is written in parity memory cell array 2 at the time of manufacturing in order to generate, by the arithmetic operation of ECC 9 detection and correction of 1 bit error generated in the 38 bits of data d0-d31 and P0-P5 read out simultaneously from regular memory cell array 1 and parity memory cell array 2 to ECC 9. The parity data to be written in parity memory cell array 2 is determined according to the stored data of memory cell array 1.

The data to be read out to an external source is previously written into memory cell array 1 at the time of manufacturing. However, for various reasons, there are some cases where the data read out from memory cell array 1 is not the proper data. In such a case, the data read out from memory cell array 1 is corrected to the proper data by the operation of ECC 9.

ECC 9 is provided simultaneously with 32 bits of data d0-d31 to be read out to an external source, and 6 bits of parity data P0-P5 required to correct an error of one bit generated in the 32 bits of data. ECC 9 carries out predetermined operation with the 32 bits of data d0-d31 and 6 bits of parity data P0-P5 to provide a 32-bit data to output buffer 10. If there is no error, the 32-bit data is directly provided to output buffer 10. If there is an error in one of the 32 bits of data d0-d31 read out, the erroneous bit is corrected, whereby the 32-bit data is provided to output buffer 10.

In the present invention, ECC 9 selectively provides to output buffer 10 the less significant 16 bits of data d0-d15 and the more significant 16 bits of data d16-d31 of the error corrected 32 bits of data d0-d31.

Output buffer 10 amplifies the output signals of ECC 9, i.e. the corrected 16 bits of data d0-d15 (or d16-d31) to provide the same to data output terminals DT0-DT15.

Output buffer 10 comprises 16 buffer circuits of OUT0-OUT15 corresponding to the 16 bits of data provided from ECC 9. The 16 buffer circuits of OUT0-OUT15 are connected to the 16 data output terminals of DT0-DT15.

Control circuit 6 responds to an externally supplied control signal from control signal input terminal CTL to control the operation such as of address buffer 5 and output buffer 10.

FIG. 11 is a block diagram schematically showing the internal structure of ECC 9 of FIG. 10.

Before the description of the structure of ECC 9 is given, the arithmetic procedure and error correction mechanism of ECC 9 will be briefly described with reference to FIG. 11. The details of error correction and circuit thereof are provided in "Interface", Aug. 1984, pp. 236-250.

An error correction code y of m bits for detecting and correcting an error of 1 bit is represented as:

$$y = (y0\ y1\ \ldots\ y(m-1)) \tag{1}$$

where y0, y1, . . . , y (m−1) are the logic values of the least significant bit, the second least significant bit, . . . the most significant bit of the error correction code.

Similarly, an error correction code having no erroneous bit, i.e. an expected data x of the m-bit data is represented as:

$$x = (x0\ x1\ \ldots\ x(m-1)) \tag{2}$$

where x0, x1, . . . , x (m−1) represent the proper logic values of the least significant bit, the second least significant bit, . . . , the most significant bit of the error correction code.

The indication of difference between respective bits of logic values of y0-y (m−1) of the error correction code and corresponding expected data of x0-x (m−1) is represented by the following matrix e (referred to as an error matrix hereinafter), where y=x+e holds.

$$e = (e0\ e1\ \ldots\ e(m-1)) \tag{3}$$

where e0, e1, . . . , e (m−1) represent the logic values of the offset of the least significant bit y0, the second least significant bit y1, . . . the most significant bit y (m−1) from corresponding expected data of x0, x1, . . . x (m−1), respectively. It is assumed that a logic value of 0 designates that there is no offset from the expected value and a logic value of 1 designates that there is an offset from the expected data. In the following equations, the operators of + in a circle and X represent addition and multiplication, respectively, with 2 as a modulus.

By the relationship of y=x+e, the relationship between the logic value yj of an arbitrary bit of the error correction code and the expected data thereof xj (j=0, 1, . . . (m−1)) is represented by the following equation:

$$yj = xj \oplus ej \tag{4}$$

FIG. 20 is the truth table of modulo 2 addition. It can be appreciated from FIG. 20 that if the value B to be added is 0, the added result coincides with value A to which value B is added. If the value to be added B is 1, the added result indicates a logic value opposite that of value A to which value B is to be added.

Therefore, if the logic values of e0-e (m−1) are known, the expected values of x0-x (m−1) of each bit can be determined.

The presence of any error bit in error correction code x can be detected by using a matrix of elements of 1 and 0 which is called a Hamming matrix. Hamming matrix H is a matrix satisfying the relationship of the following equation:

$$H \cdot x = 0 \tag{5}$$

If the logic values y0-y (m−1) of respective bits of not-yet-corrected correction error code y match the expected value x0-x (m−1), the relationship of H·x=0 holds. If the logic value of any bit in the error correction code y differs from the corresponding expected value thereof, H·y≠0. The product H·y of Hamming matrix H and row y representing an error correction code prior to being corrected is called syndrome matrix S.

Syndrome matrix S indicates which bit of error correction code y has a logic value different from the expected value.

Syndrome matrix S can be obtained as below using a transpose $H^T$ of parity check matrix H, in accordance with the relationship among row y representing an error correction code prior to correction, expected data row x, and error matrix e.

$$e = H^T \cdot S \quad (6)$$

It is understood from the above-described equation (4) that logic value yj of an arbitrary bit of error correction code y does not have to be corrected if identical to expected value xj. On the contrary, if logic value yj of an arbitrary bit differs from expected value xj thereof, logic value yj of that bit must be inverted. An error matrix is obtained by equation (6), and the proper logic value xj of an arbitrary bit of the error correction code can be obtained by:

$$xj = yj \oplus j \quad (7)$$

By using a predetermined Hamming matrix H, one erroneous bit generated in the error correction code of an arbitrary bit length can be corrected.

When the error correction code is constituted by the original data of $m_1$ bit length to be corrected, and parity data of $m_2$ bit length, Hamming matrix H is a matrix of $m_2$ rows and $m_1$ columns, as shown in FIG. 22. FIG. 22 shows a typical form of a Hamming matrix.

Detection and correction of a bit error in a 32-bit data necessitates the addition of a 6-bit parity data to the 32-bit data. The operation for correcting an error of 1 bit generated in data of 32 bits will be described hereinafter.

The error correction code of 32-bit data d0–d31 and 6-bit parity data P0–P5 is represented by the following sequence DP:

$$DP = (d0 \; d1 \ldots d31 \; P0 \; P1 \ldots P5)$$

A Hamming matrix H of 6 rows × 38 columns is determined according to the proper logic values of each bit of d0–d31, P0–P5 of the error correction code. In the following description, the element of the i-th row and the j-th column in Hamming matrix H is represented as h (i, j). Hamming matrix H is represented as follows:

$$H = \begin{bmatrix} h(0,0) & \ldots & h(0,31) & h(0,32) & \ldots & h(0,37) \\ h(1,0) & \ldots & h(1,31) & h(1,32) & \ldots & h(1,37) \\ \vdots & & & & & \vdots \\ h(5,0) & & \cdot & \cdot & & h(5,37) \end{bmatrix}$$

where (i=0, 1, 2 ... 5; j=0, 1, 2 ... 37). Elements S0–S5 of syndrome matrix S are obtained the following calculation according to sequence DP corresponding to the error correction code and Hamming matrix H.

$$S = \begin{pmatrix} S0 \\ S1 \\ \vdots \\ S5 \end{pmatrix} = H \cdot \begin{pmatrix} d0 \\ d1 \\ \vdots \\ d31 \\ P0 \\ \vdots \\ P5 \end{pmatrix} \quad (8)$$

$$= \begin{pmatrix} d0 \cdot h(0,0) \oplus \ldots \oplus d31 \times h(0,31) \oplus P0 \times h(0,32) \oplus \ldots \oplus P5 \times h(0,37) \\ d0 \cdot h(1,0) \oplus \ldots \oplus d31 \times h(1,31) \oplus P0 \times h(1,32) \oplus \ldots \oplus P5 \times h(1,37) \\ \vdots \\ d0 \cdot h(5,0) \oplus \ldots \oplus d31 \times h(5,31) \oplus P0 \times h(5,32) \oplus \ldots \oplus P5 \times h(5,37) \end{pmatrix}$$

It can be appreciated from equation (8) that an arbitrary element Si of syndrome matrix S is obtained by the following calculation according to the i-th elements of h (i, 0)–h (i, 37) of Hamming matrix H and logic values of d0–d31 and P0–P5 of the relative bits of the error correction code.

$$Sj = d0 \times h(i,0) \oplus d1 \times h(i,1) \ldots \oplus d31 \times h(i,31) \\ \oplus P0 \times h(i,32) \ldots \oplus P5 \times h(i,37).$$

FIG. 21 is a truth table of modulo 2 multiplication It can be appreciated from FIG. 21 that the multiplication result (A×B) becomes 0 if the value B to be multiplied by is 0 regardless of multiplicand A. If value B to be multiplied by is 1, the multiplication result (A×B) attains a logic value identical to multiplicand A.

The i-th element Si of syndrome matrix S is obtained by adding, modulo 2, all the data of the error correction code which are to be multiplied, modulo 2, by the elements that are 1 in elements h (i, 0)–h (i, 37) of the i-th row of Hamming matrix H. Elements e0–e37 of error matrix e are calculated by the following expression in accordance with transpose $H^T$ of Hamming matrix H and elements S0–S5 of the calculated syndrome matrix.

$$e = \begin{pmatrix} e0 \\ e1 \\ \vdots \\ e31 \end{pmatrix} = H^T \cdot S = \begin{bmatrix} h(0,0) & h(1,0) & \ldots & h(5,0) \\ h(0,1) & h(1,1) & \ldots & h(5,1) \\ \vdots & \vdots & & \vdots \\ h(0,31) & h(1,31) & \ldots & h(5,31) \end{bmatrix} \begin{pmatrix} S0 \\ S1 \\ \vdots \\ S5 \end{pmatrix} \quad (9)$$

$$= \begin{pmatrix} h(0,0) \times S0 \oplus h(1,0) \times S1 \oplus \ldots \oplus h(5,0) \times S5 \\ h(0,1) \times S0 \oplus h(1,1) \times S1 \oplus \ldots \oplus h(5,1) \times S5 \\ \vdots \\ h(0,31) \times S0 \oplus h(1,31) \times S1 \oplus \ldots \oplus h(5,31) \times S5 \end{pmatrix}$$

It can be appreciated from equation (9) that an arbitrary element ej of error matrix e is expressed as follows:

$$ej = h(0,j) \times S0 \oplus h(1,j) \times S1 \oplus \cdots \oplus h(5,j) \times S5$$

The j-th element ej of error matrix e can be obtained by carrying out, modulo 2, multiplication with the elements of syndrome matrix S which should be multiplied by the elements which are 1 out of elements h (0,j)–h (5,j) in the j-th column of Hamming matrix H, and the opposite logic values of the elements of syndrome matrix S which should be multiplied by elements which are 0 of the elements in the j-th column.

Eventually, elements D0–D31 of the proper error correction code DP can be obtained by the following expression according to data d0–d31 and P0–P5 of each bit of the error correction code, and elements e0–e31 of the calculated error vector e.

$$\begin{Bmatrix} D0 \\ D1 \\ \cdot \\ \cdot \\ \cdot \\ D31 \end{Bmatrix} = \begin{Bmatrix} d0 \\ d1 \\ \cdot \\ \cdot \\ \cdot \\ d31 \end{Bmatrix} + \begin{Bmatrix} e0 \\ e1 \\ \cdot \\ \cdot \\ \cdot \\ e31 \end{Bmatrix} \begin{Bmatrix} d0 \oplus e0 \\ d1 \oplus e1 \\ \cdot \\ \cdot \\ \cdot \\ d31 \oplus e31 \end{Bmatrix} \quad (10)$$

The calculated elements of D0–D31 are respectively the expected data of the respective bits of the data to be read out to an external source.

Thus, ECC 9 of FIG. 10 detects and corrects one bit error occurring in the data of 32 bits which are to be provided to an external source. The circuit configuration of ECC 9 will be explained with reference to FIG. 11. In the logic circuit, the high level potential and the low level potential correspond to logic values of 1 and 0, respectively.

A syndrome signal generator 90 generates 6 bits of syndrome signals S0–S5 and respective inverted signals corresponding to the aforementioned syndrome signals by carrying out an operation according to a predetermined Hamming matrix H for the 32 bits of data d0–d31 and the 6 bits of parity data P0–P5 read out from regular memory cell array 1 and parity memory cell array 2, respectively, of FIG. 10.

Specifically, an arbitrary syndrome signal Sj is obtained by carrying out an operation equal to that expressed in (8) with logic circuitry in syndrome signal generator 90.

A correction signal generator 91 generates 32 bits of correction signals e0–e31 corresponding to elements e0–e31 of the above-described error matrix e by carrying out operation according to the predetermined Hamming matrix for all the twelve bits of signals of the 6 bits of syndrome signals S0–S5 and the respective inverted signals generated from syndrome Signal generator 90.

Specifically, an arbitrary correction signal ej is obtained by executing an operation equal to that represented by (9) with logic circuitry in correction signal generator 91.

FIG. 12 is an example of a conventional Hamming matrix used for detecting and correcting an error of 1 bit generated in a 32-bit data. Syndrome signal generator 90 and correction signal generator 91 are implemented according to Hamming matrix H.

In the operation of obtaining syndrome signals, the respective bits of data in the error correction code correspond to the respective elements of each row of Hamming matrix H (refer to expression (8)).

In the operation of obtaining correction signals, each of the correction signals corresponds to the respective column of Hamming matrix H, and the respective bits of data of the syndrome signal correspond to the respective elements of each columns of Hamming matrix H (refer to equation (9)).

In the event of using Hamming matrix H indicated in FIG. 12, syndrome signal S0, for example, is calculated by adding, modulo 2, the 16 data of d10–d17, d25–d31 and P0 which correspond to the 16 elements which are 1 in the elements in the first row of Hamming matrix H. Similarly, syndrome signal S1 is obtained by adding, modulo 2, all the 16 data of d11–d25 and P1 which correspond to the 16 elements which are 1 in the elements in the second row of Hamming matrix H. In the same manner, each of syndrome signals S2–S5 is obtained by adding, modulo 2, all the 16 data corresponding to the elements which are 1 in the respective third to sixth rows of Hamming matrix H.

For example, syndrome signal S0 is obtained by the following operation:

$$S0 = d10 \oplus d11 \oplus \cdots \oplus d17 \oplus d25 \oplus d26 \oplus \cdots d31 \oplus P0$$

The modulo 2 addition is equivalent to exclusive OR in logical operation. Therefore, syndrome signal S0 is obtained by taking exclusive OR for all the sixteen data of d10–d17, d25–d31 and P0.

Similarly, each of the other five syndrome signals S1–S5 can be obtained by taking exclusive OR for the 16 data corresponding to the elements which are 1 in the elements in the corresponding row of Hamming matrix H.

Syndrome signal generator 90 includes a plurality of EX–OR gates. FIG. 13 is a circuit diagram showing a structure of syndrome signal generator 90 where the Hamming matrix H of FIG. 12 is used.

Referring to FIG. 13, syndrome signal generator 90 comprises six circuit blocks 90-1 to 90-6 generating syndrome signals of S0–S5, respectively.

Each of circuit blocks 90-1 to 90-6 comprises eight 2-input EX–OR gates 900a, four 2-input EX–OR gates 900b for receiving as an input the outputs of two EX–OR gates of the eight EX–OR gates 900a, two 2-input EX–OR gates 900c for receiving as an input the outputs of two EX–OR gates of the four EX–OR gates 900b, and a 2-input EX–OR gate 900d for receiving as an input the outputs of the two EX–OR gates 900c.

Each of circuit blocks 90-1 to 90-6 is supplied with 16 data of the 38 data of d0–d31 and P0–P5, which are required for calculating syndrome signals S0–S5.

FIG. 14 is a table showing the 16 input signals of I1–I16 to each of circuit blocks 90-1 to 90-6.

It can be understood from FIG. 14 that the input signals of I1–I16 to the respective circuit blocks of 90-1, 90-2, . . . , 90-6, are the 16 data corresponding to the elements of the first row, of the second row, . . . of the sixth row of Hamming matrix H which are 1, respectively. Therefore, the output signals from each EX–OR gate 900d in respective circuit blocks 90-1 to 90-6 are the six syndrome signals of S0–S5.

Each of circuit blocks 90-1 to 90-6 further comprises an inverter 900e for inverting the output of EX–OR gate 900d. Therefore, inverted signals of the six syndrome signals of S0–S5 are provided from inverter 900e in each of respective circuit blocks 90-1 to 90-6.

Each of correction signals e0–e31 are obtained by multiplying, modulo 2, the syndrome signals corresponding to the elements in the corresponding column of Hamming matrix H which are 1 by the inverted signals of the syndrome signals corresponding to the elements which are 0.

In the case the Hamming matrix H of FIG. 12 is employed, correction signal e0 for example, is obtained, modulo n, by multiplying two syndrome signals S4 and S5 corresponding to the elements which are 1 in the elements of the first column of Hamming matrix H by the four inverted signals of syndrome signals S0–S4 corresponding to the elements which are 0. That is to say, correction signal e0 is calculated by carrying out the following operation.

$$e0 = /S0 \times /S1 \times /S2 \times /S3 \times S4 \times S5$$

where /S0–/S3 represent the inverted signals of syndrome signals S0–S3, respectively.

The modulo 2 multiplication is equivalent to logical product in logical operation. Therefore, each of the 32 correction signals of e0–e31 is obtained by taking the logical product of all the 6 signals of the syndrome signals corresponding to the elements which are 1 and the inverted signals of the syndrome signals corresponding to the elements which are 0 of the elements of the corresponding columns of Hamming matrix H.

Accordingly, correction signal generator 91 comprises 32 circuit blocks which carry out an operation equivalent to that of an AND gate.

FIG. 15 is a circuit diagram showing an example of a structure of correction signal generator 91 where the Hamming matrix of FIG. 12 is employed.

Referring to FIG. 15, correction signal generator 91 comprises circuit blocks 91-1 to 91-32 for generating correction signals e0–e31, respectively.

Each of the 32 circuit blocks of 91-1 to 91-32 comprises two 3-input NAND gates 910a, and a 2-input NOR gate 910b for receiving as inputs the outputs of the two NAND gates 910a.

FIG. 16 is a table showing the six input signals i1–i6 provided to each of circuit blocks of 91-1 to 91-32. As shown in FIG. 16, NAND gate 910a of circuit block 91-1, NAND gate 910a of circuit block 91-2, . . . , NAND gate 910a of circuit block 91-32 are provided with the total of six signals of the syndrome signals corresponding to the elements which are 1 and the inverted signals of the syndrome signals corresponding to the elements that are 0 in the first column of Hamming matrix H, the total of 6 signals of the syndrome signals corresponding to the elements that are 1 and the inverted signals of the syndrome signals corresponding to the elements that are 0 in the second column of Hamming matrix H, . . . , the total of 6 signals of the syndrome signals corresponding to the elements that are 1 and the inverted signals of the syndrome signals corresponding to the elements that are 0 in the 32nd column of Hamming matrix H.

In each of circuit blocks of 91-1 to 91-32 forming correction signal generator 91, the output potential of NOR gate 910b attains a high logic level only when the output potentials of the two NAND gates 910a are both at a low level. The output potentials of the two NAND gates 910a both attain a low level only when the six input signals i1–i6 to these NAND gates 910a are all at a high level. In other words, the circuit implemented with two NAND gates 910a and one NOR gate 910b carries out an operation equivalent to that of a 6-input NAND gate.

Thus, correction signals e0, e1, . . . , e31 are provided from the NOR gate 910b of circuit block 91-1, circuit block 91-2, . . . , circuit block 91-32, respectively.

Referring to FIG. 11 again, data correction circuit 92 carries out the operation of (10) for correction signals e0–e31 generated from correction signal generator 91 and the 32 bits of data d0–d31 from regular memory cell array 1. FIG. 17 is a circuit diagram showing the structure of data correction circuit 92 where the Hamming matrix of FIG. 12 is shown.

Referring to FIG. 17, data correction circuit 92 comprises 32 2-input EX-OR gates 920.

EX-OR gates 92-1, 92-2 . . ., 92-32 are provided with correction signal e0 and data signal d0, correction signal e1 and data signal d1, . . . , correction signal e31 and data signal d31, respectively. Therefore, the output terminals of the 32 EX-OR gates 92-1, 92-2 . . ., 92-32 show the exclusive OR signal of signals e0 and d0, the exclusive OR signal of signals e1 and d1, . . . , the exclusive OR signal of signals e31 and d31.

The 32 data signals d0–d31 appear at the output terminals of the respective EX-OR gates 92-1 to 92-32 inverted when differing from the corresponding expected values, and not inverted when matching the corresponding expected value. Thus, 32 bits of data signals d0–d31 with an error, if any, corrected, are provided as the proper data D0–D31 from the 32 EX-OR gates 92-1 to 92-32.

Referring to FIG. 11 again, a data selector 93 is controlled by a select signal SE to select and provide the 16 bits of signals D0–D15 or the other 16 bits of signals D16–D31 from data correction circuit 92.

FIG. 18 is a circuit diagram showing a structure of data selector 93.

Referring to FIG. 18, data selector 93 comprises sixteen circuit blocks 93-1 to 93-16. Each of circuit blocks 93-1 to 93-16 comprises two P channel MOS transistors 930a and 930c, and two N channel MOS transistors 930b and 930d. Transistors 930a and 930b are connected in parallel. Similarly, transistors 930c and transistor 930d are connected in parallel.

The transistors 930a and 930b of circuit block 93-1, circuit block 93-2, . . . , circuit block 93-16 are provided as the transfer gates of corrected data signals D0, D1, . . . , D15.

Similarly, the transistors 930c and 930d of circuit block 93-1, circuit block 93-2, . . . , circuit block 93-16 are provided as the transfer gates of the corrected data signals D16, D17, . . . , D31.

Select signal SE and an inverted signal thereof are provided to the gates of transistors 930b and 930c, and to the gates of transistors 930a and 930d.

A high level potential of select signal SE causes transistors 930a and 930b to attain a conductive state, and transistors 930c and 930d to a non-conductive state. Thus, the less significant 16 bits of data signals D0–D15 of the corrected 32 bits of data signals D0–D31 are provided from the 16 circuit blocks 93-1 to 93-16. On the contrary, the low level potential of select signal SE causes transistors 930c and 930d to attain a conductive state, and transistors 930a and 930b to attain a non-conductive state. Therefore, the more significant 16 bits of data signals D16–D31 are provided from the 16 circuit blocks 93-1 to 93-16.

FIG. 19 is a table showing the relationship between the potential logic levels of select signal SE and the inverted signal thereof, and output signals of $O_0$–$O_{15}$ of data selector 93.

By switching the logic level of select signal SE, the data signals of the 16 bits of lower significance or the 16 bits of higher significance can be selectively provided. Select signal SE and the inverted signal thereof are generated from control circuit 6 of FIG. 10, for example.

As described above, a conventional ECC comprises a syndrome signal generator formed of a plurality of circuit blocks identical in number with the number of parity data simultaneously read out from a memory cell array, and a correction signal generator and a data correction circuit each formed of a plurality of blocks that are identical in number with the number of data excluding parity data read out.

Each of the plurality of circuit blocks forming the syndrome signal generator requires many input signal lines and includes many logical gate circuits. The circuit complexity of the syndrome signal generator is great.

Each of the plurality of circuit blocks forming correction signal generator and data correction circuit do not require as many input signal lines as for each of the plurality of circuit blocks forming the syndrome signal generator. However, the number of circuit blocks forming the correction signal generator and the number of circuit blocks forming the data correction circuit are significantly greater than those forming the syndrome signal generator. Therefore, the circuit complexity of the correction signal generator and the data correction circuit is great.

Thus, the occupying area of an ECC on the semiconductor substrate was great in a conventional semiconductor memory device having an ECC, leading to the problem that the area on the semiconductor substrate for the memory cell array is reduced.

In the case of the mask ROM of FIG. 10, for example, ECC 9 comprises 6 circuit blocks 90-1 to 90-6, each requiring 16 input signal lines and 15 EX-OR gates (refer to FIG. 13); 32 circuit blocks 91-1 to 91-32, each requiring 6 input signal lines, 2 NAND gates, and one NOR gate (refer to FIG. 15); and 32 EX-OR gates 92-1 to 92-32, each requiring 2 input signal lines.

Therefore, a conventional semiconductor memory device with an error correction function had a problem that it was difficult to increase memory capacity without increasing the chip size.

SUMMARY OF THE INVENTION

An object of the present invention is to provide a semiconductor memory device having a function to correct an error in data read out from a memory cell array without reducing storage capacity.

Another object of the present invention is to improve the stored capacity of a semiconductor memory device having an ECC.

A further object of the present invention is to provide a semiconductor memory device having an ECC of reduced circuit complexity.

Still another object of the present invention is to reduce the number of logic gates and signal lines forming an ECC used in a semiconductor memory device.

A still further object of the present invention is to correct a data error using an ECC formed of circuit elements less in number than a conventional one.

According to an aspect of the present invention, a semiconductor memory device includes: a memory cell array storing data to be read out to an external source and a plurality of parity data suiting the data to be read out; a reading circuit for reading out the plurality of data to be read out and the plurality of parity data from the memory cell array; and an error correction circuit for correcting an error in data read out from the memory cell array by carrying out an operation according to a predetermined Hamming matrix for the data read out from the memory cell array by the reading circuit.

In order to achieve the above objects, the plurality of data to be read out to an external source equally divided into first and second groups of data, and the error correction circuit includes: a syndrome signal producing circuit for producing a plurality of syndrome signals according to the first and second groups of data read out from the memory cell array; a group selecting circuit for sequentially selecting the first group and the second group of data read out from the memory cell array; correction signal producing circuit for sequentially producing correction signals for the first group of data and correction signals for the second group of data in synchronization with the select operation of the group selecting circuit, in response to the syndrome signal produced by the syndrome signal producing circuit; and a circuit for correcting an error in the data selected by the group selecting circuit, in response to the correction signals produced by the correction signal producing circuit.

The syndrome signal producing circuit further produces inverted signals of the plurality of syndrome signals. The correction signal producing circuit includes a signal selecting circuit for sequentially selecting signals required for the first group of data and signals required for the second group of data from the plurality of syndrome signals and inverted signals thereof, and a generating circuit for generating correction signals responsive to the signal selected by the signal selecting circuit.

According to another aspect of the present invention, a method of correcting a data error in a semiconductor memory device including a memory cell array having stored a plurality of data equally divided into a first group and a second group, and a plurality of parity data suiting the plurality of data, the method includes the steps of: reading out from the memory cell array the first and second groups of data and the plurality of parity data; producing a plurality of syndrome signals according to the read out first and second groups of data and the plurality of parity data; selecting sequentially the read out first and second groups of data; producing sequentially correction signals for the first group of data and a correction signals for the second group of data in synchronization with the selection, in response to the produced syndrome signals; and correcting the error of the data of the selected group, in response to the produced correction signals.

As set forth above, the semiconductor memory device and the data correction method according to the present invention is implemented so that the correction signal producing circuit for producing correction signals selectively generates correction signals for half of the plurality of data excluding the parity data and correction signals for the remaining half of the plurality of data, and that the data correction circuit for correcting an error according to correction signals selectively carries out error correction for half of the plurality of data read out from the memory cell array (excluding parity data) and for the remaining half of the plurality of data. Thus, the correction signal producing circuit can be realized by circuitry having complexity substantially equal to that of circuitry which produces correction signals for half of the plurality of data to be read out to an external source, and the data correction circuit can be realized by circuitry having complexity substantially equal to that of circuitry correcting an error for half of the plurality of data to be read out to an external source according to a correction signal corresponding to the data.

In these aspects, a predetermined Hamming matrix preferably includes a plurality of elements arranged in a plurality of rows corresponding to the plurality of syndrome signals. The plurality of elements are arranged in a plurality of first columns corresponding to the data of the first group, a plurality of second columns corresponding to the data of the second group, and a plurality of third columns corresponding to the plurality of parity data. The plurality of first columns and the plurality of second columns have a one-to-one correspondence to each other to form a plurality of pairs. The first column and the second column forming each pair include first rows having elements of the same value, and second rows having elements different from each other. The number of the second rows is equal in all the plurality of pairs.

Each element indicates the syndrome signal and the inverted signal corresponding to the row where that element is arranged by the values of 1 and 0, respectively, and the data and the inverted data thereof corresponding to the column where that element is arranged by the values of 1 and 0, respectively. Using the Hamming matrix, the signal selecting circuit includes a plurality of first signal switching circuits provided corresponding to the pairs and each of the plurality of first signal switching circuits switches to provide either the syndrome signals or the inverted signals indicated by the elements arranged in the second rows out of the elements of the first column included in the corresponding pair, or the syndrome signals or the inverted signals indicated by the elements arranged in the second rows out of the elements of the second column included in the corresponding pairs.

The correction signal producing circuit includes a plurality of first logic circuits provided corresponding to the plurality of pairs. Each of the plurality of first logic circuits produces a logical product signal from the syndrome signals or the inverted signals indicated by the elements arranged in the first rows of the elements of the first column included in the corresponding pair and the outputs of the corresponding first signal switching circuit. The group selecting circuit includes a plurality of second signal switching circuits provided corresponding to the plurality of pairs. Each of the plurality of second signal switching circuits switches to provide either the data corresponding the first column included in the corresponding pair, or the data corresponding to the second column included in the corresponding pair. The data correction circuit includes a plurality of third logic circuits provided corresponding to the plurality of pairs. Each of the plurality of third logic circuits produces an exclusive OR signal from the output signal of the corresponding first logic circuit and the output signal of the corresponding second signal switching circuit.

In accordance with the Hamming matrix as described-above, reduction of circuit complexity of the ECC is facilitated since the structure of particularly the correction signal producing circuit is simplified.

Thus, according to the present invention, the occupying area of an ECC in a semiconductor memory device is drastically reduced since error correction can be carried out under performance similar to that of a conventional one in an ECC having a circuit complexity alleviated than a conventional one.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram tabulating input signals I1–I16 to each of circuit blocks 110-1 to 110-6 of FIG. 4.

FIG. 7 is a diagram tabulating input signals to each of circuit blocks 111-1 to 111-16.

FIG. 14 is a diagram tabulating input signals to each of circuit blocks 90-1 to 90-6 of FIG. 13.

FIG. 16 is a diagram tabulating input signals to each of circuit blocks 91-1 to 91-32 of FIG. 15.

FIG. 19 is a diagram tabulating the relationship between the logic levels of select signal and the output data of the ECC.

FIG. 20 is a diagram of a truth table of modulo 2 addition.

FIG. 21 is a truth table of modulo 2 multiplication.

DESCRIPTION OF THE PREFERRED EMBODIMENTS

Figure 1:
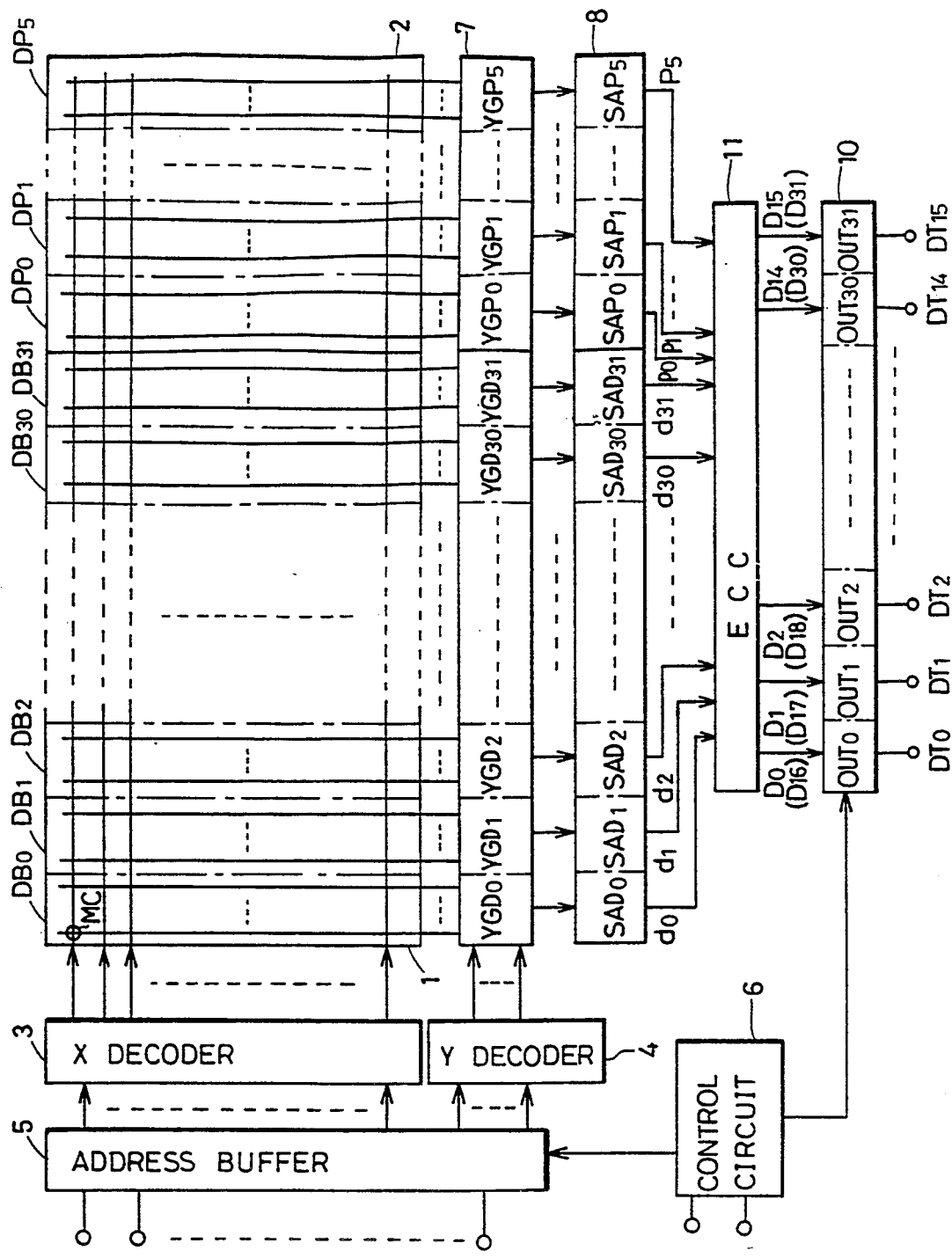
FIG. 1 is a block diagram schematically showing the entire structure of a mask ROM according to an embodiment of the present invention.

FIG. 1 is a block diagram schematically showing the entire structure of a mask ROM according to an embodiment of the present invention.

Figure 10:
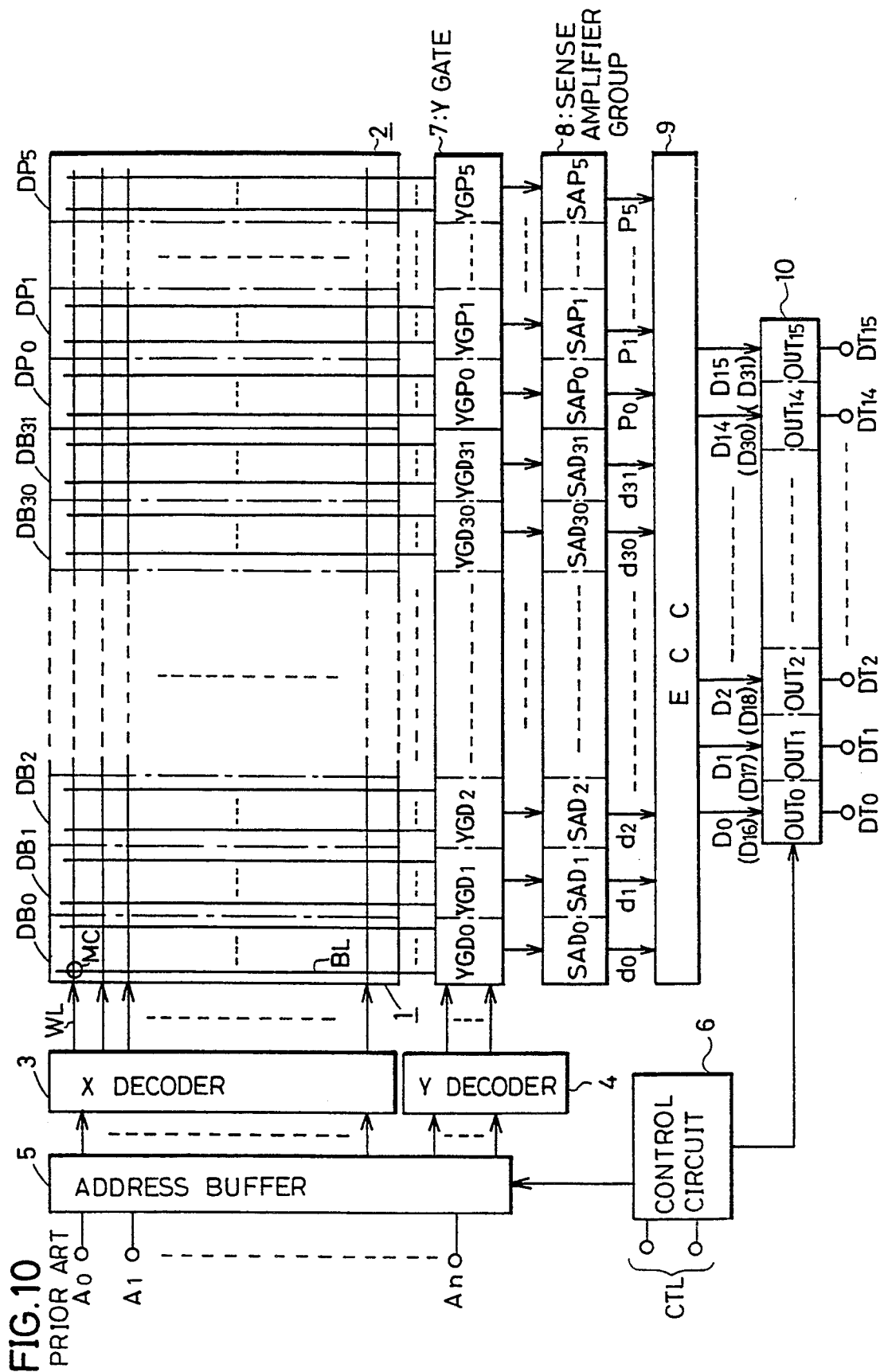
FIG. 10 is a block diagram schematically showing the entire structure of a conventional mask ROM with error correction function.
Figure 11:
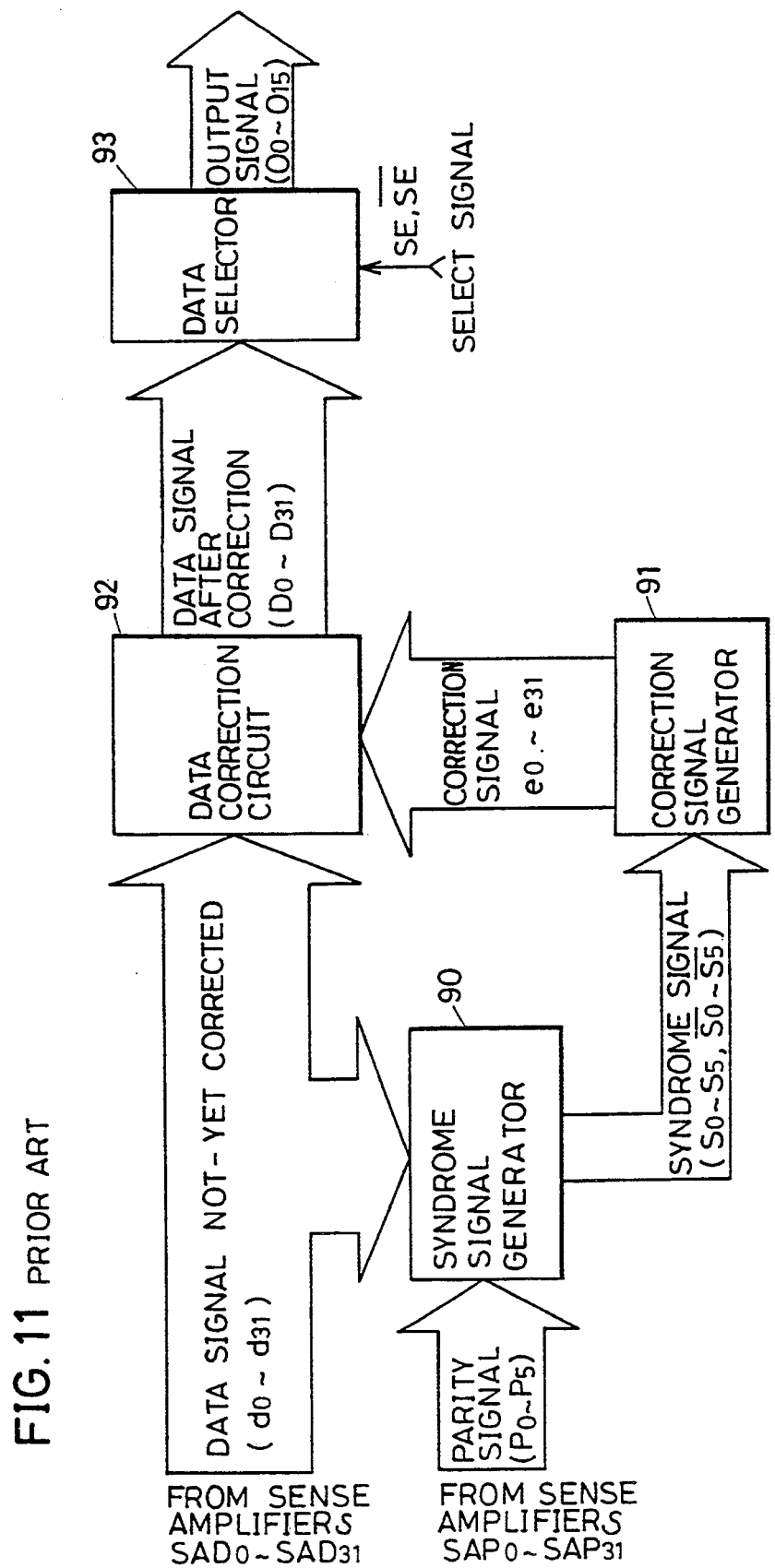
FIG. 11 is a block diagram schematically showing a structure of the ECC of FIG. 10.

The structures of circuitry included the mask ROM is similar to those of a conventional one shown in FIG. 10, except for the structure of an ECC 11.

Figure 2:
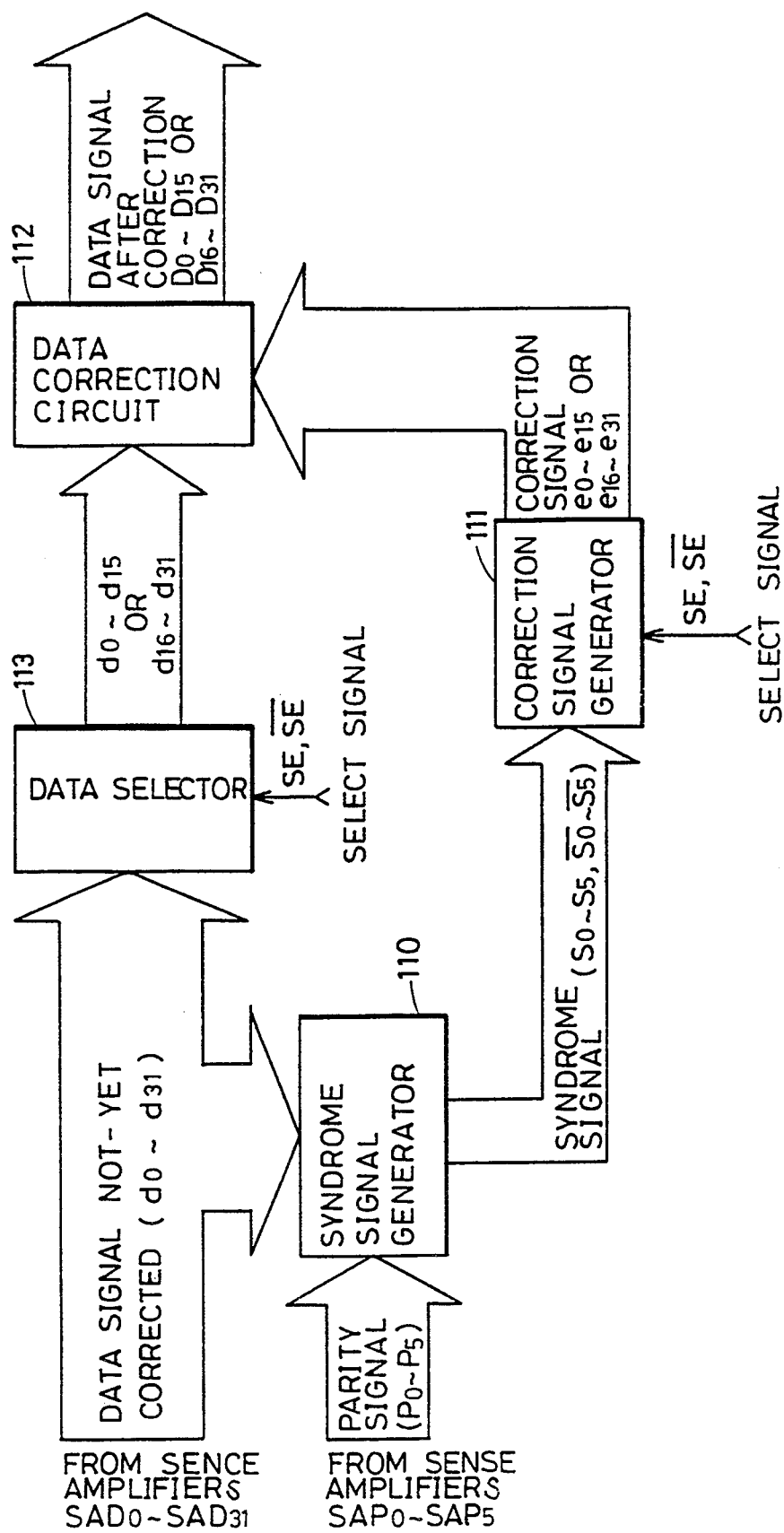
FIG. 2 is a block diagram schematically showing a structure of the ECC of FIG. 1.

FIG. 2 is a block diagram schematically showing the structure of ECC 11 of FIG. 1. Referring to FIG. 2, an important difference in the ECC of the present embodiment from a conventional one is that data selector 113 is provided at a stage preceding data correction circuit 112, and that correction signal generator 111 provides 16 bits of signals e0–e15 or e16–e31.

Figure 3:
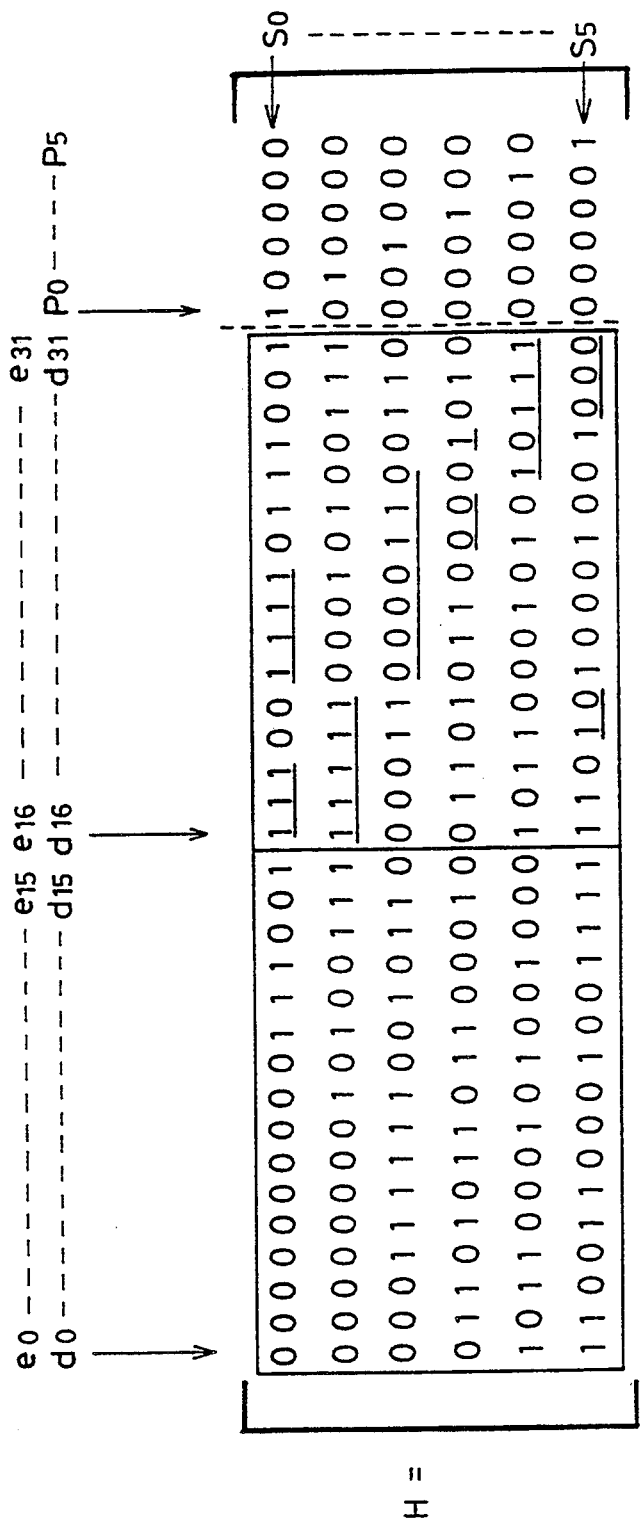
FIG. 3 is a diagram showing an example of a Hamming matrix used for error correction in the present invention.

This structure is implemented by carrying out a series of operation for error correction in ECC 11 according to a Hamming matrix H indicated in FIG. 3, for example. FIG. 3 shows an example of a Hamming matrix that enables the structure of FIG. 2.

Referring to FIG. 3, the Hamming matrix H has a regularity which is not seen in a Hamming matrix with which a series of operation is carried out in a conventional ECC. In the Hamming matrix H of FIG. 3 where there are 6 elements in each column of the 32 columns, only two of the 6 elements in each column have values different from those of the corresponding 6 elements in the column which is 16 columns ahead.

For example, comparing the 6 elements of the first column and the 6 elements of the 17th column, the values of the elements on the first row and the second row are 0 in the first column, whereas they are 1 on the corresponding rows in the 17th column. The elements from the third to six rows of the first column are identical to those of the 17th column.

Similarly, comparing the 4th column and the 20th column, the values of the elements of the 2nd row and the 6th row are 0 in the 4th column, whereas they are 1 in the 20th column. The values of elements of the first row and 3rd to 5th rows of the 4th column match those of the 20th column.

The mechanism of error correction in the ECC for the present embodiment is identical to that of a conventional one. Syndrome signal generator 110 of FIG. 2 generates the 6 syndrome signals S0, S1, . . . , S5 by taking the exclusive ORs of the elements corresponding to the elements which are 1 in the first row, in the second row, in the 6th row of Hamming matrix H from the 32 bits of data signals d0–d31 and 6 bits of parity data P0–P5.

Figure 4:
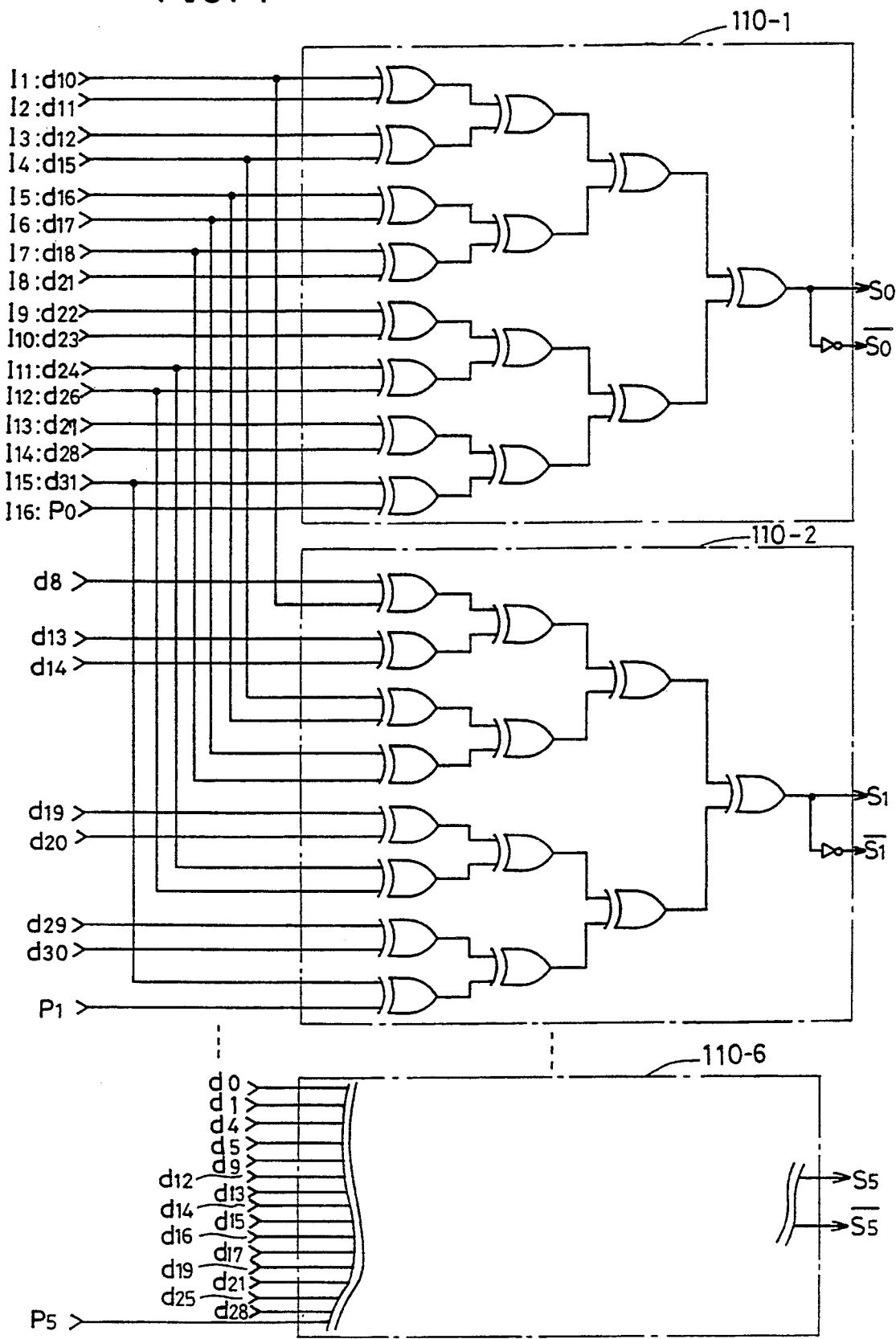
FIG. 4 is a circuit diagram showing a structure of a syndrome signal generator of FIG. 2.

FIG. 4 is a circuit diagram showing a structure of syndrome signal generator 110. Referring to FIG. 4, syndrome signal generator 110 comprises 6 circuit blocks 110-1 to 110-6 for generating 6 syndrome signals S0–S5, respectively.

Figure 13:
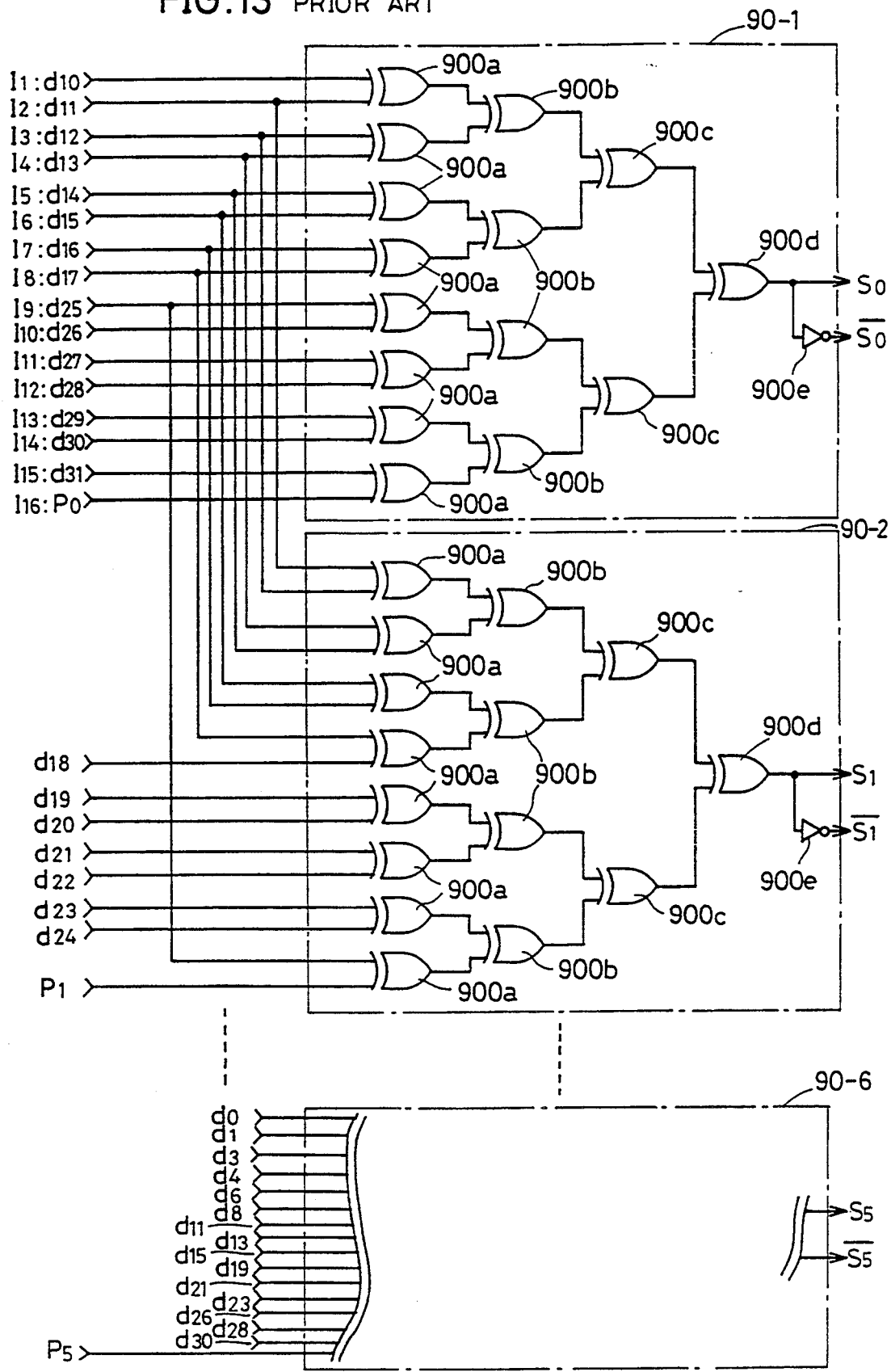
FIG. 13 is a circuit diagram showing a structure of the syndrome signal generator of FIG. 11.

Each of the 6 circuit blocks 110-1 to 110-6 has a structure identical to that of each of the 6 circuit blocks 90-1 to 90-6 forming the syndrome signal generator in the conventional ECC of FIG. 13, to also provide inverted signals of syndrome signals S0–S5.

Figure 12:
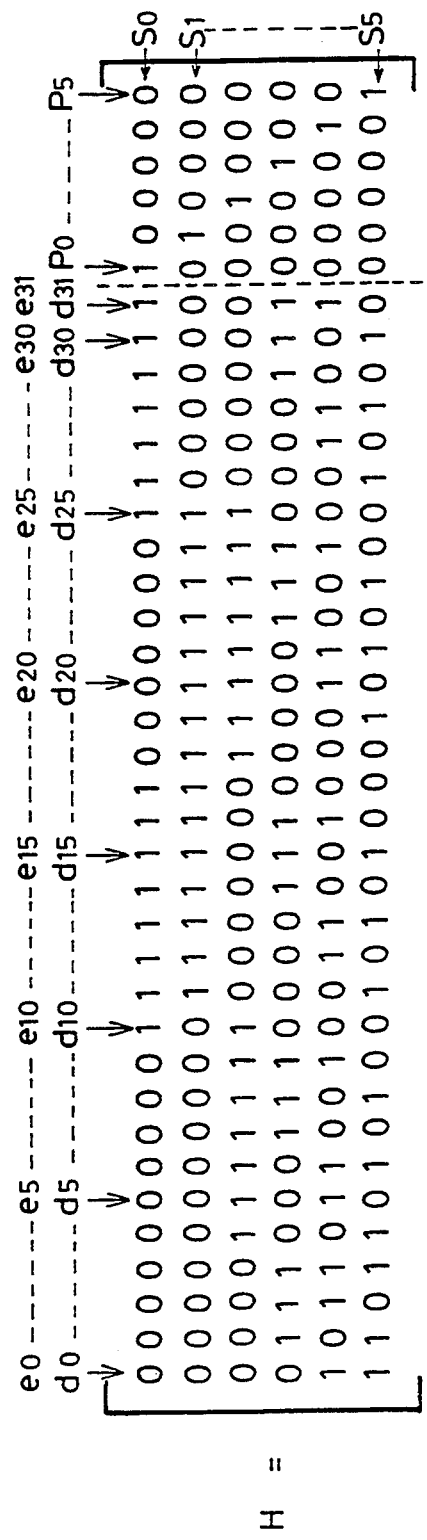
FIG. 12 is a diagram showing an example of a Hamming matrix used for error correction in a conventional ECC.

It should be noted that the 16 signals Ii–I16 provided to each of circuit blocks 110-1 to 110-6 differ from those shown in FIG. 13, since the Hamming matrix (FIG. 3) used in the present embodiment differs from that (FIG. 12) used in a conventional ECC.

For example, syndrome signal S0 is obtained by taking all the exclusive OR of the 16 data of d10–d12, d15–d18, d21–d24, d26–d28, d31, and P0 corresponding to the 16 elements which are 1 in the elements of the first row in Hamming matrix H (FIG. 3). The following represents the expression for calculating syndrome signal S0.

$$S0 = d10 \oplus d11 \oplus d12 \oplus d15 \oplus d16 \oplus d17 \oplus d18 \oplus d21 \oplus d22 \oplus d23 \oplus d24 \oplus d26 \oplus d27 \oplus d28 \oplus d31 \oplus P0$$

FIG. 5 is a diagram tabulating input signals I1–I16 to each of circuit blocks 110-1 to 110-6 of FIG. 4.

Referring to FIG. 2 again, correction signal generator 111 is controlled by a signal identical to select signal SE controlling data selector 113 for generating either signals e0–e15 of the 16 bits of lower significance or signals e16–e31 of the 16 bits of higher significance of the 32 bits of correction signals e0–e31, according to syndrome signals S0–S5 and the inverted signals thereof.

Figure 6:
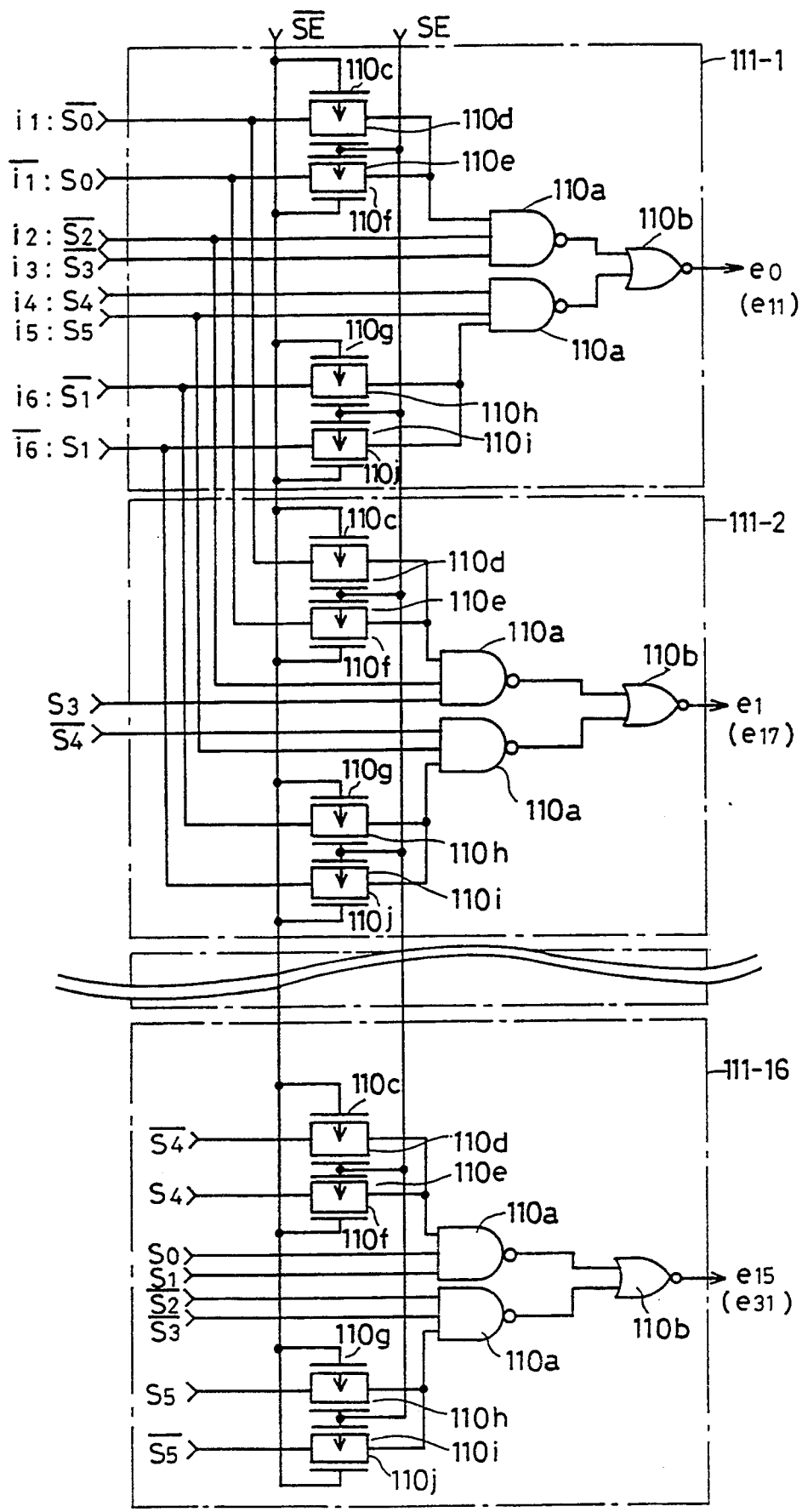
FIG. 6 is a circuit diagram showing a structure of the correctional signal generator of FIG. 2.

FIG. 6 is a circuit diagram showing a structure of correction signal generator 111.

Figure 15:
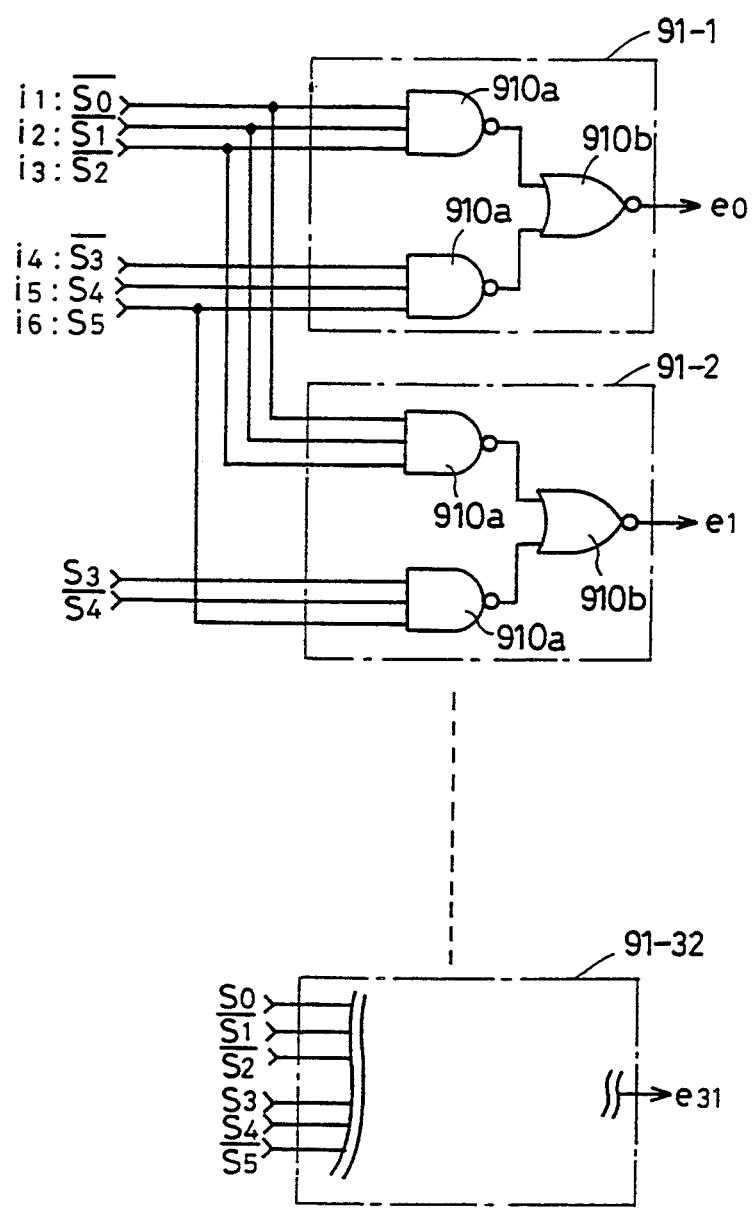
FIG. 15 is a circuit diagram showing a structure of the correctional signal generator of FIG. 11.
Figure 17:
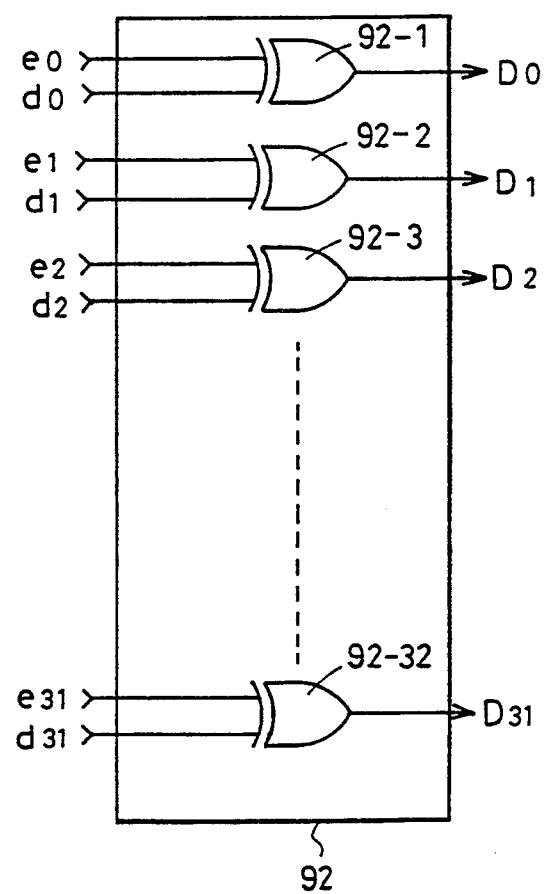
FIG. 17 is a circuit diagram showing a structure of the data correction circuit of FIG. 11.
Figure 18:
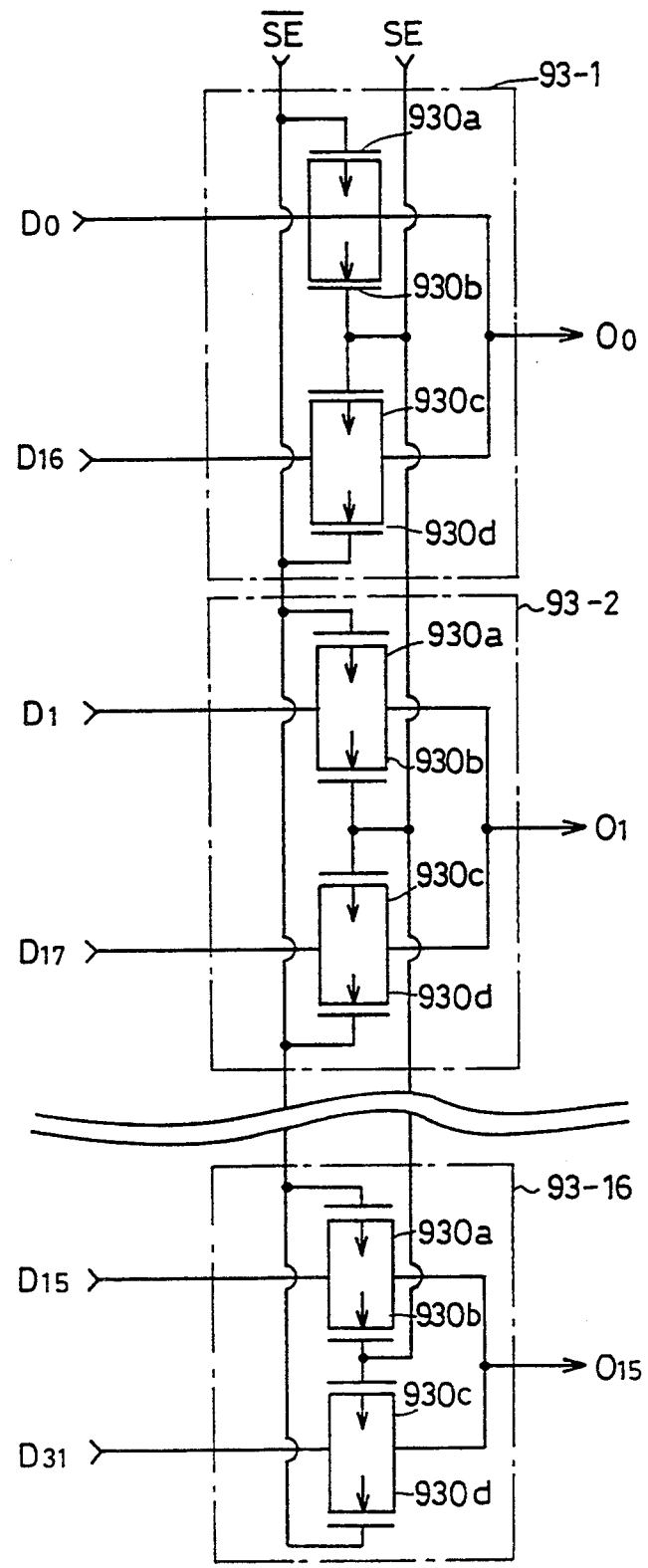
FIG. 18 is a circuit diagram showing a structure of the data selector of FIG. 11.
Figure 22:
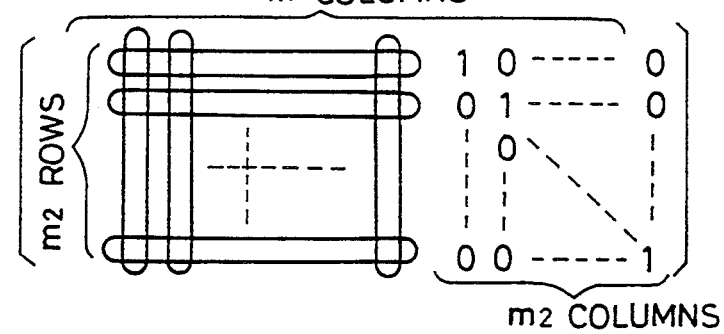
FIG. 22 is a diagram of showing a typical Hamming matrix.

Referring to FIG. 6, correction signal generator 111 comprises 16 circuit blocks 111-1 to 111-16 which is less in number of circuit blocks forming a conventional correction signal generator (FIG. 15).

Each of circuit blocks 111-1 to 111-16 differs from a conventional correction signal generator in that each block comprises 4 P channel MOS transistors 110c, 110e, 110g, 110i, and 4 N channel MOS transistors 110d, 110f, 110h, 110j, in addition to two 3-input NAND gates 110a and one 2-input NOR gate 110b. Select signal SE and the inverted signal thereof are provided to the gates of transistors 110d, 110e, 110h, and 110i, and the gates of transistors 110c, 110f, 110g, and 110j, respectively.

The 32 correction signals of e0, e1, . . . , e31 are obtained by taking the logical product of a total of 6 signals of syndrome signals corresponding to the elements which are 1 on the first column and the inverted signals of the syndrome signals corresponding to the elements which are 0 on the first column of Hamming matrix H, the syndrome signals corresponding to the elements which are 1 on the second column and the inverted signals of the syndrome signals corresponding to the elements which are 0 on the second column in Hamming matrix H, . . . , the syndrome signals corresponding to the elements which are 1 on the 32nd column and the inverted signals of the syndrome signals corresponding to the elements which are 0 in the 32nd column of Hamming matrix H.

In the present embodiment, Hamming matrix H has a regularity as described above. Therefore, the signals required for calculating correction signal e16, the signals required for calculating correction signal e17 . . . , the signals required for calculating correction signal e31, coincide with the inversion of the logic values of two signals out of the signals required for calculating correction signal e0 and the remaining same signals, the inversion of the logic values of two signals out of the signals required for calculating correction signal e1 and the remaining same signals, . . . , the inversion of the logic values of two signals out of the signals required for calculating correction signal e15 and the remaining same signals.

For example, referring to FIG. 3, correction signal e0 is obtained by taking the logical product of a totals 6 signals, i.e. two syndrome signals S4 and S5 corresponding to the elements four which are 1 in the first column, and inverted signals-of four sydrome signals S0–S3 corresponding to the elements which are 0 in the first column of the Hamming matrix H. Correction signal e16 is obtained by taking the logical product of a total of 6 signals, i.e. four syndrome signals S0, S2, S4, S5 corresponding to the elements which are 1 on the 17th column and inverted signals of two syndrome signals S2 and S3 corresponding to the elements which are 0 in the 17th column. The following equation shows the calculation for obtaining error correction signals e0 and e16.

$$e0 = /S0 \times /S1 \times /S2 \times /S3 \times S4 \times S5$$

$$e16 = S0 \times S1 \times /S2 \times /S3 \times S4 \times S5$$

It can be appreciated from the above equation that, in order to obtain correction signal e16 for example, the two inverted signals of/S1 and/S1, i.e. S0 and S1, and remaining 4 syndrome signals used in obtaining correction signal e0 are required.

It is therefore appreciated from FIG. 6 that a total of 8 signals included in the syndrome signals for calculating correction signals e0 and e16 are provided to circuit block 111-1 for generating correction signals e0 and e16.

In circuit block 111-1, transistors 110c and 110d, and transistors 110g and 110h are provided as the transmission gates for the two signals (the inverted signals of syndrome signals S0 and S1) which are not included in the syndrome signals for calculating correction signal e16 out of the syndrome signals for calculating correction signal e0. Similarly, transistors 110e and 110f, and transistors 110i and 110j are provided as the transmission gates for the two signals S0, S1 not included in the syndrome signals for calculating correction signal e16 out of the syndrome signals for calculating correction signal e0. The outputs of transistors 110c and 110d, and the output of transistors 110e and 110f are provided to the same input terminal of one NAND gate 110a. The output signals of transistors 110g and 110h, and the output signals of transistors 110i and 110j are provided to the same input terminal of the other NAND gate 110a.

A high level potential of select signal SE causes transistors 110c, 110d, 110g and 110h to attain a conductive state, and transistors 110e, 110f, 110i and 110j to attain a non-conductive state. Therefore, in circuit block 111-1, 6 syndrome signals necessary for calculating correction signal e0 are provided to NAND gate 110a, whereby the output of NOR gate 110g becomes correction signal e0.

On the contrary, a low level potential of select signal SE causes transistors 110e, 110f, 110i and 110j to attain a conductive state, and transistors 110c, 110d, 110g and 110h a non-conductive state. Therefore, in circuit block 111-1, the 6 syndrome signals required to calculate correction signal e16 are the input signals to NAND gate 110a, whereby the output signal of NOR gate 110b becomes correction signal e16.

The other circuit blocks 111-2, 111-3, ..., 111-16 are provided with all the syndrome signals required to calculate correction signals e1 and e17, correction signals e2 and e18, ..., correction signals e15 and e31.

FIG. 7 tabulates the eight input signals i1-i6,/i1-i6 (/i1-/i6 represent the inverted signals of signals i1-i6) to each of circuit blocks 111-1 to 111-16.

Each of circuit blocks 111-2 to 111-16 has a structure similar to that of circuit blocks 111-1.

In circuit block 111-k, where k is an arbitrary integer of 1 to 16, transistors 110c and 110d and transistors 110g and 110h are provided as the transfer gates for the two syndrome signals not included in the syndrome signals for calculating correction signal e (k+15) out of the syndrome signals for calculating correction signal e (k−1).

Transistors 110e and 110f and transistors 110i and 110j are provided as the transfer gates for the two signals not included in the syndrome signals for calculating correction signal e (k−1) out of the syndrome signals for calculating correction signal e (k+15). Four input terminals of the six input terminals of the two NAND gates 110a are commonly provided with four signals commonly included in the syndrome signals for calculating correction signal e (k−1) and correction signal e (k+15). One of the remaining two input terminals is provided commonly with the output signals of transistors 110c, 10d, 110e and 110f. The other input terminal of the remaining two terminals is provided commonly with the output signals of transistors 110g, 110h, 110i and 110j.

Thus, circuit blocks 111-2 to 111-16 provide correction signals e1-e15 and correction signals e16-e31 when select signal SE attains a high level and a low level, respectively.

Referring to FIG. 2 again, data selector 113 is controlled by select signal SE to provide signals d0-d15 which are the less significant 16 bits of the 32 bits of data signals d0-d31 or signals d16-d31 which are the more significant 16 bits of the 32 bits of data signals d0-d31 to data correction circuit 112.

Figure 8:
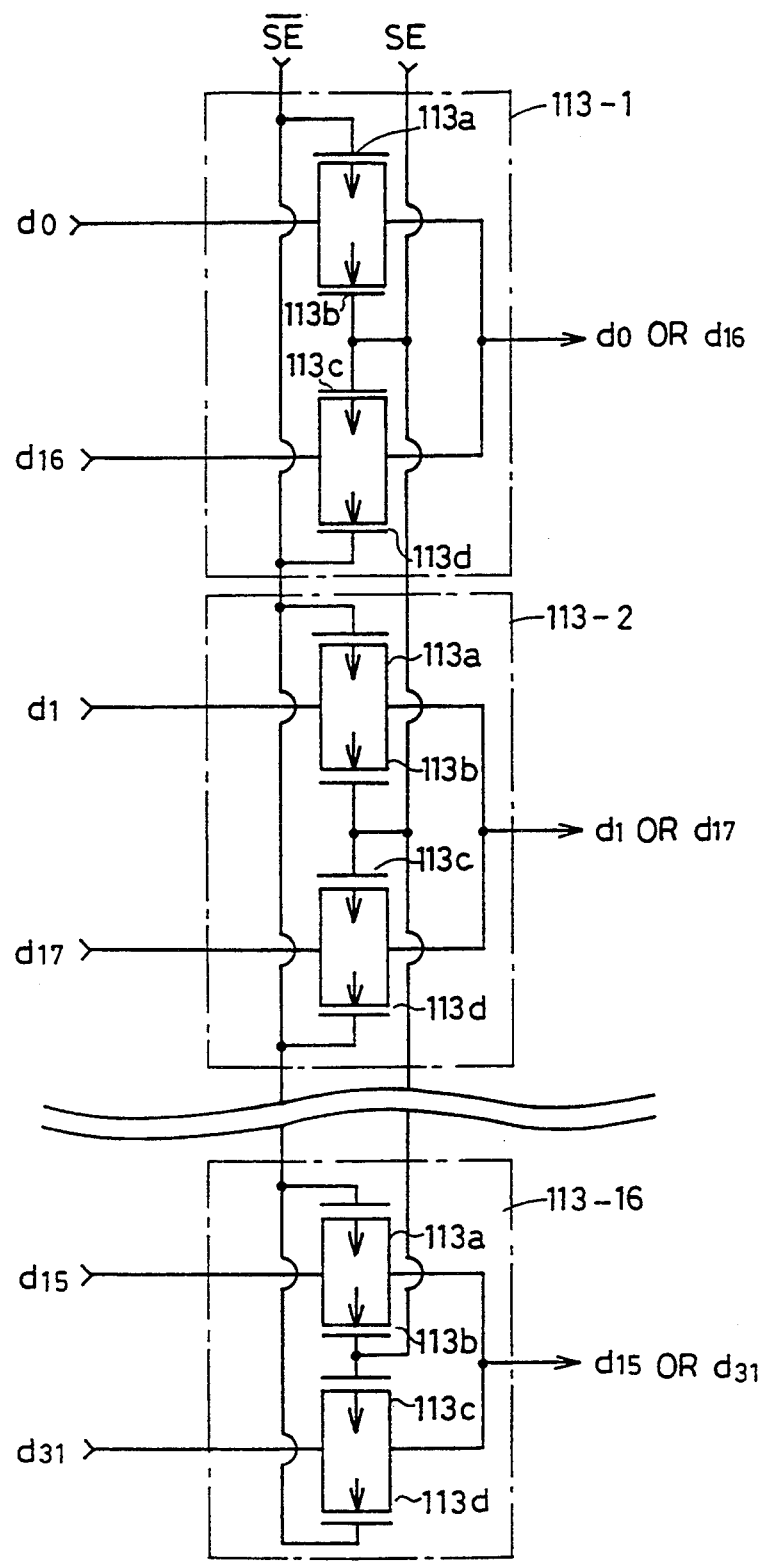
FIG. 8 is a circuit diagram showing a structure of the data selector of FIG. 2.

FIG. 8 is a circuit diagram showing a structure of data selector 113. Referring to FIG. 8, data selector 113 comprises 16 circuit blocks 113-1 to 113-16.

Each of circuit blocks 113-1 to 113-16 comprises two P channel MOS transistors 113a and 113c, and two N channel MOS transistors 113-b and 113d. Select signal SE and the inverted signal thereof are provided to the gates of transistors 113b and 113c, and the gates of transistors 113a and 113d.

Circuit blocks 113-1, 113-2, ..., 113-16 are provided with data d0 and data d16 which is of higher significance by 16 bits than data d0, data d1 and data d17 which is of higher significance by 16 bits than data d1, ..., data d15 and data d31 which is of higher significance by 16 bits than data d15. In each of circuit blocks of 113-1 to 113-16, transistors 113a and 113b, and transistors 113c and 113d are provided as the transfer gates for the data of the lower significance and the higher significance, respectively, of the two input data.

Therefore, select signal SE attaining a high level causes transfer gates 113a and 113b provided corresponding to input data of the lower significance to concuct, and select signal SE attaining a low level causes transfer gates 113c and 113d provided corresponding to the input data of the higher significance to conduct in respective circuit blocks 113-1 to 113-16. As a result, data signals d0-d15 of the 16 bits of lower significance and data signals d16-d31 of the 16 bits of higher significance are provided from the 16 circuit blocks 113-1 to 113-16 when select signal SE attains a high level and a low level, respectively.

Data correction circuit 112 corrects an error in the 16 data signals from data selector 113 by taking the exclusive OR from the respective data signals d0-d15 (or d16-d31) provided from data selector 113, and the 16 correction signals e0-e15 (or e16-e31) generated from correction signal generator 111.

Figure 9:
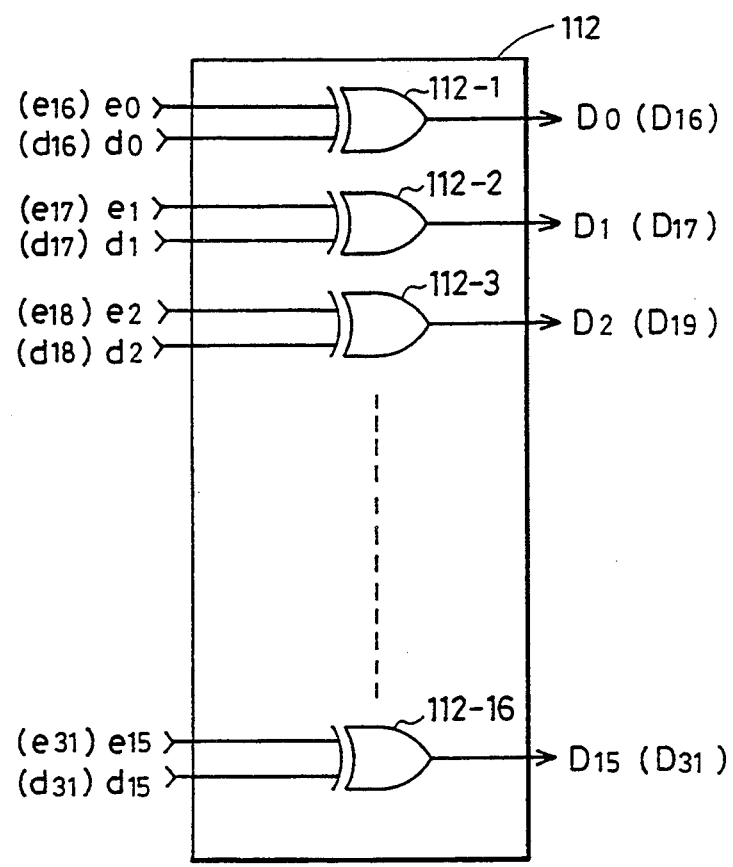
FIG. 9 is a circuit diagram showing a structure of the data correction circuit of FIG. 2.

FIG. 9 is a circuit diagram showing a structure of data correction circuit 112.

Referring to FIG. 9, data correction circuit 112 comprises 16 2-input EX-OR gates 112-1 to 122-16. EX-OR gates 112-1, 112-2, ..., 112-16 are provided with output signals d0 (d16) from circuit block 113-1 of data selector 113 and output signal e0 (e16) from circuit block 111-1 of correction signal generator 111, output signal d1 (d17) from circuit block 113-2 of data selector 113 and output signal e1 (e17) from circuit block 111-2 of correction signal generator 111, ..., output signal d15 (d31) from circuit block 113-16 of data selector 113 and output signal e15 (e31) from circuit block 111-16 of correction signal generator 111.

Circuit blocks 113-1 to 113-16 of data selector 113 and circuit blocks 111-1 to 111-16 of correction signal generator 111 provide data signals d0-d15 and correction signals e0-e15, and data signals d16-d31 and correction signals e16-e31, when select signal SE attains a high level and a low level, respectively.

Thus, when select signal SE attains a high level, the output signals of EX-OR gates 112-1 to 112-16 are the exclusive OR signal of data signals d0-d15 of the 16 bits of lower significance and the corresponding correction signals e0-e15, respectively. When data select signal SE attains a low level, the output signals of EX-OR gates 112-1 to 112-16 are the exclusive OR signals of data signals d16-d31 of the 16 bits of higher significance and the corresponding correction signals e16-e31.

This means that if there is one bit of data error in the 16 bits of lower significance of data signals d0-d15, that error is corrected. If there is no error, data signals d0-d15 directly appear at the output terminals of EX-OR gates 112-1 to 112-16 when select signal SE attains a high level. Similarly, an error, if any, in 1 bit of data signals d16-d31 of the more significant 16 bits is corrected. If there is no error, data signals d16-d31 appear at the output terminals of EX-OR gates 112-1 to 112-16 when select signal SE attains a low level.

By switching in a conventional manner the logic level of select signal SE, corrected data signals d0-d15 of the least significant 16 bits and corrected data signals d16-d31 of the more significant 16 bits are selectively provided from ECC 11.

In the present embodiment, the 32 data whose error is to be detected and corrected are divided into two groups, where error correction for the two groups is carried out by the same circuit. This means that the number of circuit blocks (16) forming the correction signal generator and the number of EX-OR gates (16) forming the data correction circuit are reduced to a half of those of a conventional case (32). Therefore, the number of component elements for the correction signal generator, the number of input signal lines to the data correction circuit, and the number of component elements for data correction circuit are reduced significantly. As a result, the circuit complexity of ECC 11 of the present invention is drastically reduced in comparison with a conventional one.

An ECC having a structure similar to that of the present embodiment can be implemented by not only the Hamming matrix H shown in FIG. 3, but with any Hamming matrix having a regularity similar to that of Hamming matrix H of FIG. 3. For example, another possible Hamming matrix enabling implementation of ECC of the present embodiment is a matrix where the order of the 32 columns shown in FIG. 3 are interchanged. More specifically, by using a matrix formed of 16 pairs of columns of the 32 columns corresponding to data d0-d31 of the 38 data d0-d31 and P0-P5 read out simultaneously to the ECC from the memory cell array, where each pair of columns have just M (M=a constant number; 2 in the above embodiment) elements differing from each other, one group of the 16 bits data and the other group of the remaining 16 bits data of data d0-d31 to be corrected can be implemented by the same circuit. The number of transfer gates required in circuit blocks 111-1 to 111-16 forming correction signal generator 111 depends on the number of the constant number M, which results in 2M transfer gates.

Considering layout and the like of the elements of an ECC on the substrate of a semiconductor, the Hamming matrix for the ECC used in a semiconductor memory device must have columns independent of each other, wherein the number of elements which are 1 on one row is identical and even for all rows.

Although the above-mentioned embodiment was described in which an ECC detects and corrects a single error bit in 32 bits of data, the present invention may be applied to an ECC for detecting and correcting a single error bit generated in data having a bit length other than 32 bits.

Although the above-mentioned embodiment was described where the internally read out data are provided to an external source in two operations, the same effect can be obtained by applying the present invention to a mask ROM where the number of internally read out data is identical to the number of output data.

The present invention has applicability to semiconductor memory devices such as EEPROMs and EPROMs which can have data written therein after manufacturing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a memory cell array having a plurality of data and a plurality of parity data stored therein,
   means for reading out said plurality of data and said plurality of parity data from said memory cell array and
   error correction means for correcting an error in said plurality of data by applying operation according to a predetermined Hamming matrix to said plurality of data and said plurality of parity data read out by said reading means,
   wherein said plurality of data are equally divided into a first group and a second group,
   wherein said error correction means comprises
      syndrome signal producing means for producing a plurality of syndrome signals on the basis of said first and second groups of data and said plurality of parity data read out from said memory cell array by said reading means,
      group selecting means for sequentially selecting the data of said first group and said second group read out from said memory cell array by said reading means,
      correction signal producing means for sequentially producing a correction signal for said first group of data and a correction signal for said second group of data in synchronization with the selecting operation of said group selecting means, in response to said syndrome signals produced by said syndrome signal producing means, and data correction means for correcting an error in the group of data selected by said group selecting means according to a correction signal produced by said correction signal producing means.

2. The semiconductor memory device according to claim 1, wherein said syndrome signal producing means further produces inverted signals of said plurality of syndrome signals, wherein said correction signal producing means comprises signal selecting means for sequentially selecting a signal necessary for said first group of data and a signal necessary for said second group of data, out of said plurality of syndrome signals and said inverted signals, and correction signal generating means for generating said correction signal in response to the signal selected by said signal selecting means.

3. The semiconductor memory device according to claim 2, wherein said predetermined Hamming matrix comprises a plurality of elements arranged in a plurality of rows corresponding to said plurality of syndrome signals, wherein said plurality of elements are arranged in a plurality of first columns corresponding to said first group of data, a plurality of second columns corresponding to said second group of data, and a plurality of third columns corresponding to said plurality of parity data, wherein said plurality of first columns and said plurality of second columns form a plurality of pairs, each having a one-to-one correspondence with each other, wherein the first column and the second column forming each of said pairs comprise first rows including elements of identical values, and second rows including elements of different values, and wherein the number of the second rows is equal in all of said plurality of pairs.

4. The semiconductor memory device according to claim 3, wherein each of said elements indicates the syndrome signal corresponding to the row in which it is arranged and an inverted signal thereof as values 0 and 1, respectively, and indicates the data corresponding to the column in which it is arranged and an inverted data thereof as values 1 and 0, respectively.

5. The semiconductor memory device according to claim 4, wherein said signal selecting means comprises a plurality of first signal switching means provided corresponding to said plurality of pairs, each of said plurality of first signal switching means selectively provides the syndrome signal or the inverted signal thereof indicated by the element arranged in said second row out of the elements of the first column included in the corresponding pair, and the syndrome signal or the inverted signal thereof indicated by the element arranged in said second row out of the elements in the second column included in the corresponding pair, said correction signal generating means comprises a plurality of first logic circuit means provided corresponding to said plurality of pairs, each of said plurality of first logic circuit means produces a logical product signal from the syndrome signal or an inverted signal thereof indicated by the element arranged in said first row out of the elements of the first column included in the corresponding pair, and the output of the corresponding first signal switching means.

6. The semiconductor memory device according to claim 5, wherein said group selecting means comprises a plurality of second signal switching means provided corresponding to said plurality of pairs, each of said plurality of second signal switching means selectively providing the data corresponding to the first column included in the corresponding pair and the data corresponding to the second column included in the corresponding pair.

7. The semiconductor memory device according to claim 6, wherein said plurality of first signal switching means and said plurality of second signal switching means are controlled at one unit.

8. The semiconductor memory device according to claim 7, wherein said data correction means comprises a plurality of third logic circuit means provided corresponding to said plurality of pairs, each of said plurality of third logic means producing an exclusive OR signal from an output signal of the corresponding first logic circuit means and an output signal of the corresponding second signal switching means.

9. The semiconductor memory device according to claim 8, wherein each of said second signal switching means comprises third switching means for transmitting to a corresponding third logic circuit means the data corresponding to a corresponding first column, and fourth switching means for transmitting to a corresponding third logic circuit means data corresponding to a corresponding second column, said third switching means and said fourth switching means being activated alternately.

10. The semiconductor memory device according to claim 9, wherein said third switching means comprises a third field effect semiconductor device having a first conductive terminal for receiving a corresponding data, a second conductive terminal connected to a corresponding third logic circuit means, and a control terminal for receiving said first control signal, and said fourth switching means comprises a fourth field effect semiconductor device having a first conductive terminal for receiving a corresponding data, a second conductive terminal connected to a corresponding third logic circuit means, and a control terminal for receiving said second control signal.

11. The semiconductor memory device according to claim 5, wherein each of said plurality of first logic circuit means comprises an NAND gate and an NOR gate.

12. The semiconductor memory device according to claim 4, wherein said syndrome signal producing means comprises a plurality of second logic circuit means provided corresponding to said plurality of rows, each of said second logic circuit means produces an exclusive OR signal and an inverted signal thereof of the data and parity data corresponding to elements which are 1 out of the elements of the corresponding row.

13. The semiconductor memory device according to claim 12, wherein each of said plurality of first signal switching means comprises first switching means for transferring to a corresponding first logic circuit means a syndrome signal or an inverted signal indicated by an element arranged in each of said second rows out of the elements of the first column included in the corresponding pair, and second switching means for transferring to a corresponding first logic circuit means a syndrome signal or an inverted signal indicated by an element arranged in each of said second rows out of the elements of the second column included in the corresponding pair.

14. The semiconductor memory device according to claim 13, wherein said first switching means comprises a first field effect semiconductor device having a first conductive terminal for receiving a corresponding syndrome signal or an inverted signal, a control terminal for receiving a predetermined control signal, and a second conductive terminal connected to a corresponding first logic circuit means, and said second switching means comprises a second field effect semiconductor device having a first conductive terminal for receiving a corresponding syndrome signal or an inverted signal, a second conductive terminal connected to a corresponding first logic circuit means, and a control terminal for receiving a control signal having a logic level complementary to that of said predetermined control signal.

15. The semiconductor memory device according to claim 12, wherein each of said plurality of second logic circuit means comprises a plurality of EX-OR gates and an inverter.

16. A method of correcting, according to a predetermined Hamming matrix, an error of data in a semiconductor memory device having a memory cell array in which a plurality of data and a plurality of parity data corresponding to said plurality of data are stored therein, wherein said plurality of data is equally divided into a first group and a second group, said method comprising the steps of:

reading out said first and second groups of data and said plurality of parity data from said memory cell array, producing a plurality of syndrome signals on the basis of said read out first and second groups of data and said plurality of parity data, sequentially selecting said read out first and second groups of data, producing sequentially a correction signal for said first group of data and a correction signal for said second group of data in synchronization with said selection in response to said produced syndrome signals, and correcting an error in said selected group of data in response to said produced correction signal.

17. The method according to claim 16, wherein said predetermined Hamming matrix comprises a plurality of elements arranged in a plurality of rows corresponding to said plurality of syndrome signals, wherein said plurality of elements are arranged in a plurality of first columns corresponding to said first group of data, a plurality of second columns corresponding to said second group of data, and a plurality of third columns corresponding to said plurality of parity data, wherein said plurality of first columns and said plurality of second columns form a plurality of pairs, each having a one-to-one correspondence with each other, wherein the first column and the second column forming each of said pairs comprise first rows including elements of identical values, and second rows including elements of different values, and wherein the number of the second rows is equal in all of said plurality of pairs.

* * * * *